United States Patent
Hinode et al.

(10) Patent No.: US 10,211,063 B2
(45) Date of Patent: Feb. 19, 2019

(54) SUBSTRATE PROCESSING APPARATUS AND SUBSTRATE PROCESSING METHOD

(71) Applicant: SCREEN Holdings Co., Ltd., Kyoto (JP)

(72) Inventors: Taiki Hinode, Kyoto (JP); Takashi Ota, Kyoto (JP); Kazuhide Saito, Kyoto (JP); Toshimitsu Namba, Kyoto (JP); Yasukatsu Kamihiro, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 14/812,022

(22) Filed: Jul. 29, 2015

(65) Prior Publication Data

US 2016/0035597 A1 Feb. 4, 2016

(30) Foreign Application Priority Data

Jul. 29, 2014 (JP) .................................. 2014-153910
Jul. 29, 2014 (JP) .................................. 2014-153911

(51) Int. Cl.
*B44C 1/22* (2006.01)
*C23F 1/00* (2006.01)
(Continued)

(52) U.S. Cl.
CPC .... *H01L 21/31111* (2013.01); *H01L 21/6708* (2013.01); *H01L 21/67017* (2013.01)

(58) Field of Classification Search
CPC ...................... H01L 21/31111; H01L 21/67075
(Continued)

(56) References Cited

U.S. PATENT DOCUMENTS 6,001,215 A 12/1999 Ban ............................... 156/345
8,008,087 B1 8/2011 Shalyt et al. .................. 436/72
(Continued)

FOREIGN PATENT DOCUMENTS

JP 9-275091 A 10/1997
JP 2005-079212 3/2005
(Continued)

OTHER PUBLICATIONS

Decision to Grant a Patent dated Sep. 2, 2016 in the counterpart Korean Application No. 10-2015-0104899.
(Continued)

*Primary Examiner* — Thomas T Pham
(74) *Attorney, Agent, or Firm* — Ostrolenk Faber LLP

(57) ABSTRACT

A phosphoric acid aqueous solution in a production tank circulates a circulation system. The circulation system is configured to be switchable between a first state in which the phosphoric acid aqueous solution is circulated through a bypass pipe and a second state in which the phosphoric acid aqueous solution is circulated through a filter. When a silicon containing liquid is supplied to the production tank, the circulation system is switched to the first state. When silicon particles are uniformly dispersed in the phosphoric acid aqueous solution, the circulation system is switched to the second state. Alternatively, a filtration member is provided in the production tank. The silicon containing liquid is stored in the filtration member. The filtration member is dipped in the phosphoric acid aqueous solution stored in the production tank. The silicon containing liquid is permeated through the filtration member, and is mixed with the phosphoric acid aqueous solution.

7 Claims, 21 Drawing Sheets

(51) Int. Cl.
*C03C 15/00* (2006.01)
*C03C 25/68* (2006.01)
*C25F 3/00* (2006.01)
*H01L 21/311* (2006.01)
*H01L 21/67* (2006.01)

(58) Field of Classification Search
USPC .......................................................... 216/84
See application file for complete search history.

(56) References Cited

U.S. PATENT DOCUMENTS

| | | | |
|---|---|---|---|
| 2005/0067101 A1* | 3/2005 | Funabashi | H01L 21/31111 156/345.18 |
| 2005/0211378 A1 | 9/2005 | Limori et al. | 156/345.18 |
| 2005/0263488 A1* | 12/2005 | Change | H01L 21/67086 216/83 |
| 2006/0219273 A1 | 10/2006 | Nagara | 134/56 R |
| 2008/0066863 A1* | 3/2008 | Kiyose | H01L 21/31111 156/345.15 |
| 2008/0087645 A1* | 4/2008 | Izuta | C09K 13/04 216/93 |
| 2009/0081881 A1 | 3/2009 | Kiyose | 438/753 |
| 2009/0229641 A1 | 9/2009 | Yoshida | 134/107 |
| 2009/0317980 A1 | 12/2009 | Limori et al. | 438/745 |
| 2010/0136771 A1 | 6/2010 | Kim et al. | 438/501 |
| 2011/0012066 A1 | 1/2011 | Kim et al. | 252/500 |
| 2011/0174336 A1 | 7/2011 | Nagara | 134/10 |
| 2012/0074102 A1 | 3/2012 | Magara et al. | 216/83 |
| 2012/0302482 A1 | 11/2012 | Tamura et al. | 510/165 |
| 2013/0313129 A1* | 11/2013 | Kosaka | G01N 31/228 205/786 |
| 2014/0290859 A1* | 10/2014 | Kobayashi | H01L 21/6708 156/345.15 |
| 2014/0373882 A1 | 12/2014 | Yoshida | 134/108 |
| 2015/0093906 A1 | 4/2015 | Kobayashi et al. | 438/748 |
| 2015/0262737 A1 | 9/2015 | Hinode et al. | 216/83 |
| 2016/0035597 A1 | 2/2016 | Hinode et al. | 216/84 |

FOREIGN PATENT DOCUMENTS

| | | |
|---|---|---|
| JP | 2005-260179 A | 9/2005 |
| JP | 2006-278628 | 10/2006 |
| JP | 2008-98444 A | 4/2008 |
| JP | 2009-094455 | 4/2009 |
| JP | 2009-218405 A | 9/2009 |
| JP | 2010-021215 A | 1/2010 |
| JP | 2011-203252 | 10/2011 |
| JP | 2012-074601 | 4/2012 |
| JP | 2012-531044 A | 12/2012 |
| JP | 2013-165217 A | 8/2013 |
| JP | 2015-135943 A | 7/2015 |
| JP | 2015-177139 A | 10/2015 |
| JP | 2016-32029 A | 3/2016 |
| KR | 10-2012-0033250 | 4/2012 |
| TW | 200818308 A | 4/2008 |
| TW | 201139655 A | 11/2011 |

OTHER PUBLICATIONS

Chinese Office Action dated Dec. 1, 2016 in corresponding Taiwanese Patent No. 104124262.
Decision to Grant a Patent dated Mar. 20, 2018 in counterpart Japanese Patent Application No. 2014-153910.
Decision to Grant a Patent dated Mar. 20, 2018 in counterpart Japanese Patent Application No. 2014-153911.

* cited by examiner

FIG. 6

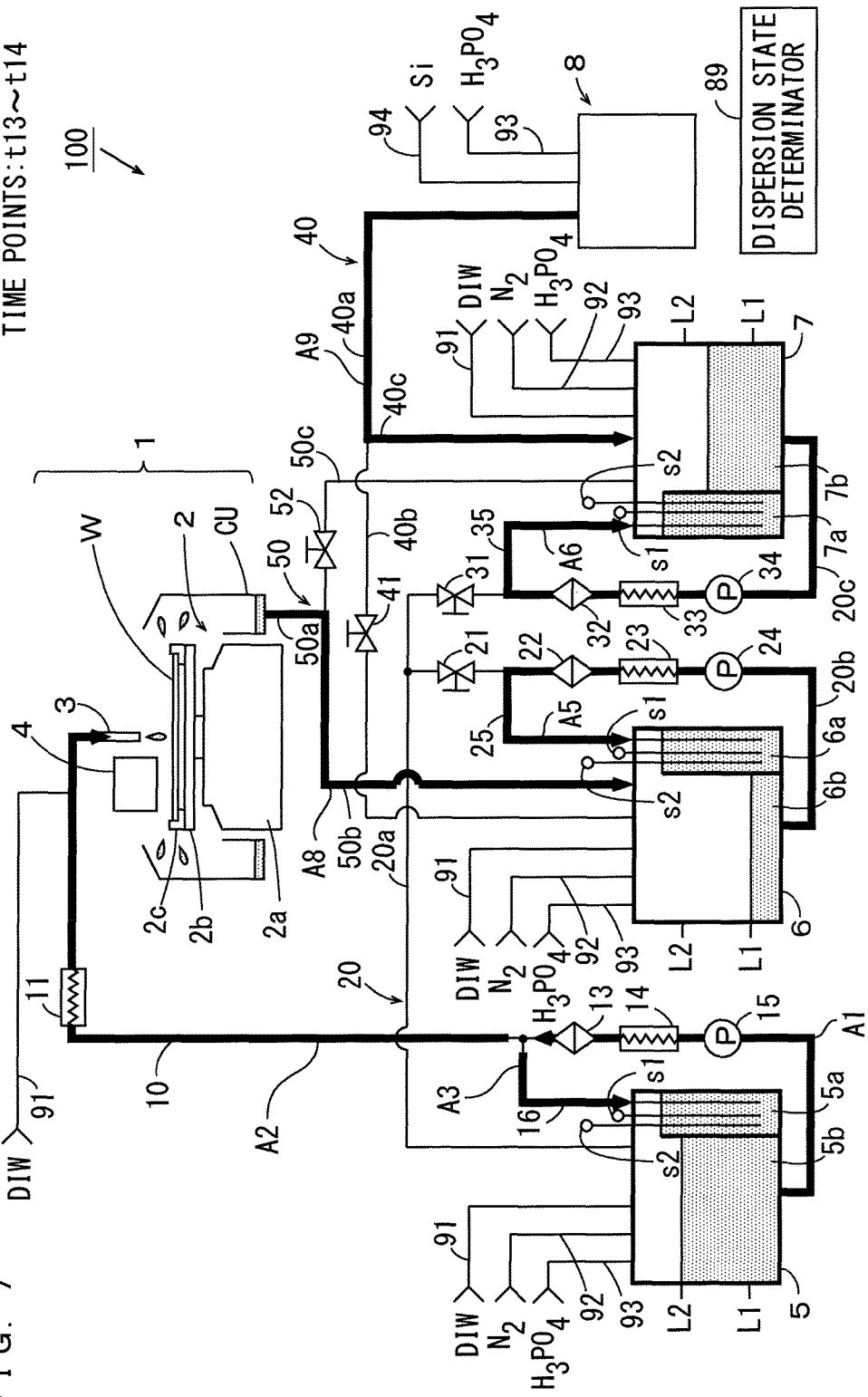

FIG. 8  TIME POINTS: t14~t15

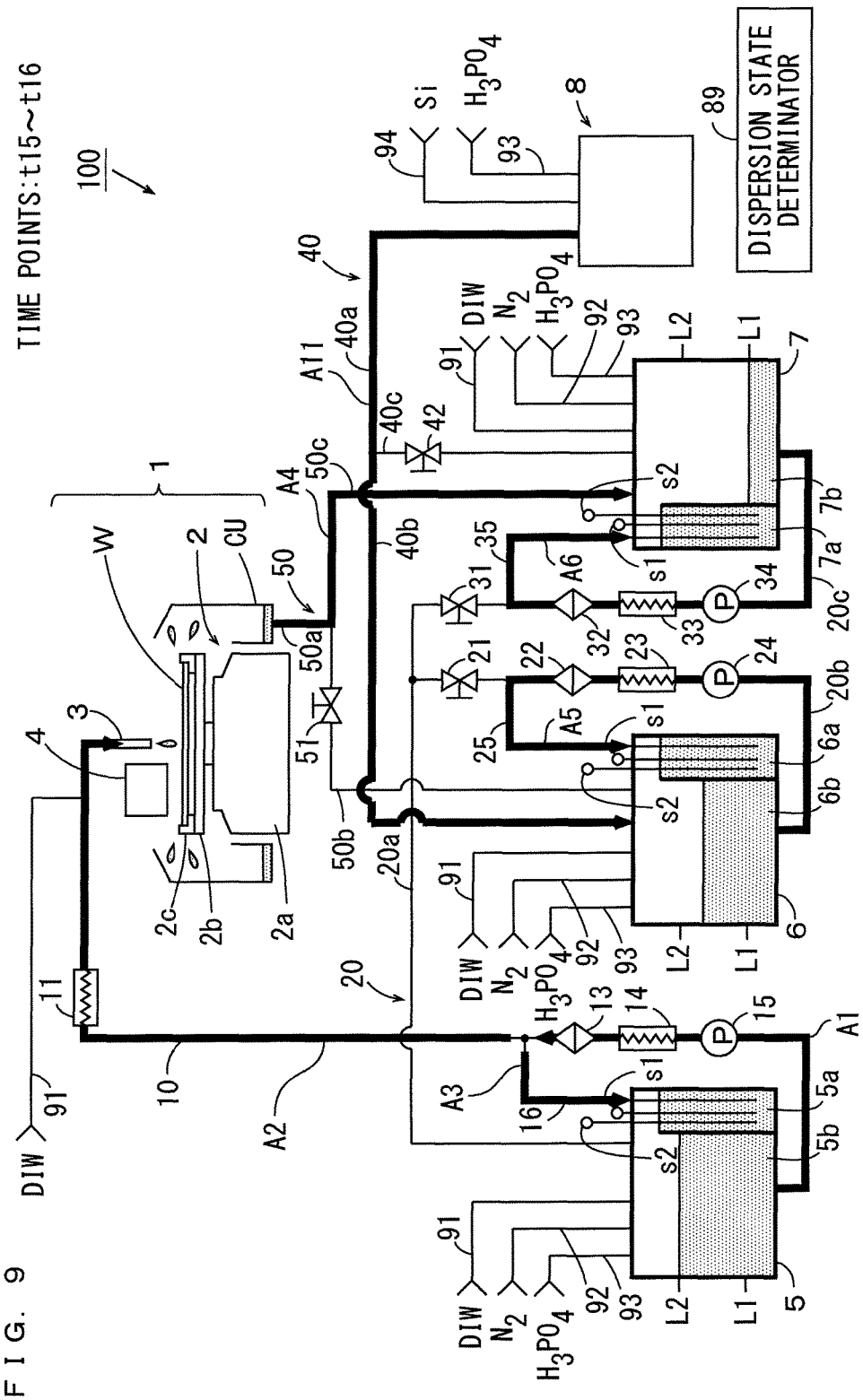

FIG. 10

SUBSTRATE PROCESSING APPARATUS AND SUBSTRATE PROCESSING METHOD

BACKGROUND OF THE INVENTION

Field of the Invention

The present invention relates to a substrate processing apparatus and a substrate processing method for performing various processes on a substrate.

Description of Related Art

Substrate processing apparatuses are conventionally used to subject substrates such as semiconductor wafers, glass substrates for photo masks, glass substrates for liquid crystal displays, glass substrates for plasma displays, substrates for optical disks, substrates for magnetic disks, substrates for magneto-optical disks, and other substrates to various types of processes. In the substrate processing apparatus, a phosphoric acid aqueous solution in which silicon concentration is appropriately adjusted is used in order to selectively etch a silicon nitride film of a silicon oxide film and the silicon nitride film on a substrate.

For example, in JP 2012-74601 A, a substrate processing apparatus that selectively etches a silicon nitride film of a silicon oxide film and the silicon nitride film formed on the substrate by supplying a processing liquid including the phosphoric acid aqueous solution towards the substrate held by the spin chuck is disclosed.

BRIEF SUMMARY OF THE INVENTION

When the silicon nitride film is selectively etched, it is required that an etching rate for each of the silicon oxide film and the silicon nitride film by the processing liquid is accurately adjusted. In order to do that, it is necessary to adjust silicon concentration in the processing liquid to predetermined concentration by replenishing an appropriate amount of a silicon compound in the processing liquid. However, in JP 2012-74601 A, a technique for replenishing the appropriate amount of the silicon compound in the processing liquid is not disclosed. Therefore, it is difficult to perform an accurate etching process in the substrate processing apparatus described in JP 2012-74601 A.

Thus, an object of the present invention is to provide a substrate processing apparatus and a substrate processing method capable of accurately performing a process of selectively etching a silicon nitride film of a silicon oxide film and the silicon nitride film on a substrate.

The inventors of the present application suggested a method of adjusting the silicon concentration in the phosphoric acid aqueous solution by adding silicon particles in the phosphoric acid aqueous solution that flows in the circulation system including a filter, and performed various experiments and studies. As a result, the inventors of the present application acquired findings that the silicon particles are caught by the filter before being dispersed in the phosphoric acid aqueous solution when the silicon particles are merely added to the phosphoric acid aqueous solution, and that it is difficult to accurately adjust the silicon concentration. The inventors of the present application devised the following invention based on these findings.

Further, the inventors of the present application suggested a method of adjusting the silicon concentration in the phosphoric acid aqueous solution by adding the silicon particles in the phosphoric acid aqueous solution stored in the tank, and performed various experiments and studies. As a result, the inventors of the present application acquired findings that a phenomenon in which the added silicon particles are aggregated and the aggregated silicon particles are not dissolved in the phosphoric acid aqueous solution occurs when the silicon particles are merely added to the phosphoric acid aqueous solution in the tank. Desired silicon concentration is not acquired in such a phosphoric acid aqueous solution, so that it is difficult to accurately perform etching. Further, the inventors of the present application acquired a finding that it is difficult to accurately adjust the silicon concentration when the aggregated silicon particles are caught by the filter or the like. The inventors of the present application devised the following invention based on these findings.

(1) A substrate processing apparatus according to one aspect of the present invention includes a processing liquid producer that produces a processing liquid including silicon and phosphoric acid, a filter arranged to remove impurities in the processing liquid produced by the processing liquid producer, and a processing unit that supplies the processing liquid from which the impurities are removed by the filter to a substrate in order to selectively remove a silicon nitride of a silicon oxide and the silicon nitride on the substrate, wherein the processing liquid producer includes a production tank that stores a first solution including the phosphoric acid, a solution supply system that produces the processing liquid by supplying a second solution including silicon particles to the production tank and mixing the second solution with the first solution, a bypass path that lets the processing liquid flow to bypass the filter, a circulation system that can be switched between a first state in which the processing liquid in the production tank is circulated through the bypass path and a second state in which the processing liquid in the production tank is circulated through the filter, a dispersion state determinator that determines whether the silicon particles in the processing liquid circulated by the circulation system are dipersed to a predetermined degree, and a switcher that switches the circulation system to the first state after supply of the second solution to the production tank by the solution supply system, and switches the circulation system to the second state when the dispersion state determinator determines that the silicon particles are dispersed to the predetermined degree.

In the substrate processing apparatus, the first solution including the phosphoric acid is stored in the production tank. The second solution including the silicon particles is supplied to the production tank, and is mixed with the first solution. After the second solution is supplied to the production tank, the circulation system is switched to the first state. In the first state of the circulation system, the processing liquid in the production tank flows in the bypass path, so that the filter is bypassed. In this case, after the second solution is supplied, aggregates of the locally concentrated silicon particles are not caught by the filter, and the processing liquid is stirred. Thus, the silicon particles in the processing liquid can be uniformly dispersed in a short period of time.

Thereafter, when the silicon particles are dispersed in the processing liquid to the predetermined degree, the circulation system is switched to the second state. In the second state of the circulation system, the processing liquid in the production tank flows through the filter. In this case, impurities in the produced processing liquid are removed by the filter. On the other hand, the silicon particles dispersed in the processing liquid are not caught by the filter. Therefore, all of the silicon particles supplied to the phosphoric acid aqueous solution can be dissolved in the phosphoric acid aqueous solution.

The processing liquid produced as described above is supplied to the substrate in order to selectively remove the silicon nitride of the silicon oxide and the silicon nitride.

As a result, the processing liquid having the uniform silicon concentration can be stably produced in a short period of time. As a result, the process of selectively etching the silicon nitride film of the silicon oxide film and the silicon nitride film on the substrate can be accurately and easily performed in a short period of time.

(2) The processing liquid producer may further include a heater that heats the first solution stored in the production tank, and a temperature measurer that measures a temperature of the first solution heated by the heater, and the switcher may switch the circulation system to the second state for a constant time period until the second solution is supplied to the production tank by the solution supply system based on the temperature of the first solution measured by the temperature measurer, before the supply of the second solution to the production tank by the solution supply system.

In this case, the first solution stored in the production tank can be heated to a temperature suitable for being mixed with the second solution. Before the second solution is supplied to the production tank, the heated first solution flows through the filter for the constant time period. Thus, the filter can be heated to the appropriate temperature by the heated first solution. Therefore, after the second solution is supplied to the production tank, when the circulation system is switched from the first state to the second state, a reduction in temperature of the processing liquid that flows through the filter is prevented.

(3) The second solution may further include an aggregation inhibitor that prevents aggregation of the silicon particles.

In this case, the silicon particles are unlikely to be aggregated in the processing liquid. Thus, the silicon particles can be uniformly dispersed in the processing liquid circulated by the circulation system in a shorter period of time.

(4) The dispersion state determinator may include a silicon concentration meter that samples part of the processing liquid in the production tank and measures silicon concentration of the sampled processing liquid, and a determinator that determines that the silicon particles are dispersed to the predetermined degree when the silicon concentration measured by the silicon concentration meter is kept in a predetermined reference range for a predetermined reference time period.

In this case, the reference time period and the reference range are appropriately determined, so that the dispersion of the silicon particles can be easily and accurately determined.

(5) The production tank may have a cylindrical sidewall. In this case, a corner portion is not present at the inner surface of the sidewall of the production tank, so that a region in which the silicon particles stay is unlikely to occur inside of the production tank. Therefore, the processing liquid can be more efficiently produced.

(6) The processing unit may include a holder that holds the substrate, and a processing liquid nozzle that supplies the processing liquid from which the impurities are removed by the filter to the substrate held by the holder.

In this case, in the processing unit, the processing liquid having the uniform silicon concentration is supplied from the processing liquid nozzle to the substrate. In this manner, the above-mentioned configuration can be applied to the single-substrate processing apparatus.

(7) A substrate processing apparatus according to another aspect of the present invention includes a processing liquid producer that produces a processing liquid including silicon and phosphoric acid, a filter arranged to remove impurities in the processing liquid produced by the processing liquid producer, and a processing unit that supplies the processing liquid from which the impurities are removed by the filter to a substrate in order to selectively remove a silicon nitride of a silicon oxide and the silicon nitride on the substrate, wherein the processing liquid producer includes a production tank that stores a first solution including the phosphoric acid, and a filtration member that is formed of a porous material having a bore diameter of not more than a bore diameter of the filter and stores a second solution including silicon particles, and at least part of the filtration member is arranged such that it can be dipped in the first solution stored in the production tank, and the processing liquid is produced by permeation of the second solution through the filtration member and mixing of the second solution with the first solution.

In this substrate processing apparatus, the first solution including the phosphoric acid is stored in the production tank. The second solution including the silicon particles is stored in the filtration member formed of the porous material having the bore diameter not more than the bore diameter of the filter. At least part of the filtration member is dipped in the first solution stored in the production tank. In this case, the processing liquid is produced by permeation of the second solution through the filtration member and mixing of the second solution with the first solution. Impuriries in the produced processing liquid are removed by the filter. The processing liquid from which the imputiries are removed by the filter is supplied to the substrate in order to selectively remove the silicon nitride of the silicon oxide and the silicon nitride on the substrate.

This configuration causes the only silicon particles that can be dissolved in the first solution to be mixed with the first solution and the other silicon particles to remain in the filtration member. In this case, an occurrence of aggregates of silicon due to aggregation of the excessive amount of the silicon particles in the production tank is prevented. Thus, an occurrence of clogging of the filter is prevented. Further, the processing liquid having the uniform silicon concentration can be stably produced in a short period of time. As a result, the process of selectively etching the silicon nitride film of the silicon oxide film and the silicon nitride film on the substrate can be accurately performed.

(8) The processing liquid producer may further include a circulation system that circulates the processing liquid between the production tank and the filter.

In this case, the temperature and cleanliness of the processing liquid in the production tank can be kept constant.

(9) The processing liquid producer may further include a heater that heats the first solution stored in the production tank, and a temperature measurer that measures a temperature of the first solution heated by the heater, and the substrate processing apparatus may further comprise a controller that controls the filtration member based on the temperature of the first solution measured by the temperature measurer such that the second solution stored in the filtration member is mixed with the first solution stored in the production tank.

In this case, the temperature of the first solution can be adjusted to the temperature suitable for the process for the substrate. Further, the second solution is mixed with the heated first solution, so that the silicon particles can be efficiently dissolved in the first solution. Thus, the processing liquid can be efficiently produced.

(10) The substrate processing apparatus may further include a driver that moves the filtration member between a first position above a liquid surface of the first solution in the production tank and a second position at which at least part of the filtration member is dipped in the first solution stored in the production tank, wherein the controller may control the driver to move the filtration member from the first position to the second position when the second solution stored in the filtration member is mixed with the first solution stored in the production tank.

In this case, the second solution can be easily mixed with the heated first solution. Thus, the processing liquid can be more efficiently produced.

(11) An amount of the silicon particles stored in the filtration member may be larger than a necessary amount of the silicon particles in order to saturate silicon concentration of the processing liquid in the production tank.

In this case, the only silicon particles that can be dissolved in the first solution are mixed with the first solution, and the other silicon particles remain in the filtration member. Therefore, it is possible to easily produce the processing liquid having the silicon saturated concentration without mixing the excessive amount of the silicon particles with the first solution.

(12) The second solution may further include an aggregation inhibiter that prevents aggregation of the silicon particles. In this case, the silicon particles are unlikely to be aggregated in the filtration member. Therefore, the second solution is permeated through the filtration member in a short period of time. Thus, the processing liquid can be produced in a short period of time.

(13) A bore diameter of the filtration member may be not more than 10 nm. In this case, a particle diameter of the silicon particles permeated through the filtration member is extremely small. Thus, the silicon particles can be efficiently dissolved in the first solution. As a result, the processing liquid can be efficiently produced.

(14) The filtration member may be formed of polytetrafluoroethylene. In this case, the porous filtration member having a minute bore diameter can be easily formed.

(15) The production tank may have a cylindrical sidewall. In this case, a corner portion is not present at the inner surface of the sidewall of the production tank, so that a region in which the silicon particles stay is unlikely to occur inside of the production tank. Therefore, the processing liquid can be more efficiently produced.

(16) The processing liquid producer may further include a stirring mechanism that stirs the processing liquid produced in the production tank. In this case, the second solution is efficiently mixed with the first solution. Thus, the production of the processing liquid can be promoted.

(17) A substrate processing method according to yet another aspect of the present invention includes the steps of producing a processing liquid including silicon and phosphoric acid, removing imputiries in the produced processing liquid by a filter, and supplying the processing liquid from which the imputiries are removed by the filter to a substrate in order to selectively remove a silicon nitride of a silicon oxide and the silicon nitride on the substrate, wherein the step of producing the processing liquid includes the steps of storing a first solution including the phosphoric acid in a production tank, producing the processing liquid by supplying a second solution including silicon particles to the production tank and mixing the second solution with the first solution, and switching a circulation system including a bypass path that lets the processing liquid flow to bypass the filter between a first state in which the processing liquid in the production tank is circulated through the bypass path and a second state in which the processing liquid in the production tank is circulated through the filter, and the step of switching includes the steps of switching the circulation system to the first state after supply of the second solution to the production tank, determining whether the silicon particles in the processing liquid circulated by the circulation system are dispersed to a predetermined degree, and switching the circulation system to the second state when it is determined that the silicon particles are dispersed to the predetermined degree.

In the substrate processing method, the first solution including the phosphoric acid is stored in the production tank. The second solution including the silicon particles is supplied to the production tank, and is mixed with the first solution. After the second solution is supplied to the production tank, the circulation system is switched to the first state. In the first state of the circulation system, the processing liquid in the production tank flows in the bypass path, so that the filter is bypassed. In this case, after the second solution is supplied, aggregates of the locally concentrated silicon particles are not caught by the filter, and the processing liquid is stirred. Thus, the silicon particles in the processing liquid can be uniformly dispersed in a short period of time.

Thereafter, when the silicon particles are dispersed in the processing liquid to the predetermined degree, the circulation system is switched to the second state. In the second state of the circulation system, the processing liquid in the production tank flows through the filter. In this case, impurities in the produced processing liquid are removed by the filter. On the other hand, the silicon particles dispersed in the processing liquid are not caught by the filter. Therefore, all of the silicon particles supplied to the phosphoric acid aqueous solution can be dissolved in the phosphoric acid aqueous solution.

The processing liquid produced as described above is supplied to the substrate in order to selectively remove the silicon nitride of the silicon oxide and the silicon nitride.

As a result, the processing liquid having the uniform silicon concentration can be stably produced in a short period of time. As a result, the process of selectively etching the silicon nitride film of the silicon oxide film and the silicon nitride film on the substrate can be accurately and easily performed in a short period of time.

(18) The step of producing the processing liquid may further include the steps of heating the first solution stored in the production tank, and measuring a temperature of the heated first solution, and the step of switching may further include the step of switching the circulation system to the second state for a constant time period until the second solution is supplied to the production tank based on the temperature of the first solution measured by the step of measuring, before the supply of the second solution to the production tank.

In this case, the first solution stored in the production tank can be heated to a temperature suitable for being mixed with the second solution. The heated first solution flows through the filter for a constant time period before the second solution is supplied to the production tank. Thus, the filter can be heated to an appropriate temperature by the heated first solution. Therefore, after the second solution is supplied to the production tank, when the circulation system is switched from the first state to the second state, a reduction in temperature of the processing liquid that flows through the filter is prevented.

(19) The step of removing may include circulating the processing liquid between the production tank and the filter. In this case, the temperature and cleanliness of the processing liquid in the production tank can be kept constant.

(20) A substrate processing method according to yet another aspect of the present invention includes the steps of producing a processing liquid including silicon and phosphoric acid, removing impurities in the produced processing liquid by a filter, and supplying the processing liquid from which the impurities are removed by the filter to a substrate in order to selectively remove a silicon nitride of a silicon oxide and the silicon nitride on the substrate, wherein the step of producing the processing liquid includes the steps of storing a first solution including the phosphoric acid in a production tank, storing a second solution including silicon particles in a filtration member formed of a porous material having a bore diameter not more than a bore diameter of the filter, dipping at least part of the filtration member in the first solution stored in the production tank, and producing the processing liquid by mixing the second solution permeated through the filtration member with the first solution.

This substrate processing method causes the first solution including the phosphoric acid to be stored in the production tank. The second solution including the silicon particles is stored in the filtration member formed of the porous material having the bore diameter not more than the bore diameter of the filter. At least part of the filtration member is dipped in the first solution stored in the production tank. In this case, the second solution is permeated through the filtration member and mixed with the first solution, so that the processing liquid including the silicon and the phosphoric acid is produced. Impurities in the produced processing liquid are removed by the filter. The processing liquid from which the impurities are removed by the filter is supplied to the substrate in order to selectively remove the silicon nitride of the silicon oxide and the silicon nitride on the substrate.

This method causes the only silicon particles that can be dissolved in the first solution to be mixed with the first solution and the other silicon particles to remain in the filtration member. In this case, an occurrence of aggregates of silicon due to the aggregation of the excessive amount of the silicon particles in the production tank is prevented. Thus, an occurrence of clogging of the filter is prevented. Further, the processing liquid having the uniform silicon concentration can be produced. As a result, the process of selectively etching the silicon nitride film of the silicon oxide film and the silicon nitride film on the substrate can be accurately performed.

(21) The step of removing may include circulating the processing liquid between the production tank and the filter. In this case, the temperature and cleanliness in the production tank can be kept constant.

(22) The step of producing the processing liquid may include heating the first solution stored in the production tank, measuring a temperature of the heated first solution, and mixing the second solution stored in the filtration member with the first solution stored in the production tank based on the measured temperature of the first solution.

In this case, the temperature of the first solution can be adjusted to a temperature suitable for the process for the substrate. Further, the second solution is mixed with the heated first solution, so that the silicon particles can be efficiently dissolved in the first solution. Thus, the processing liquid can be efficiently produced.

(23) The substrate processing method may further include the step of arranging the filtration member above a liquid surface of the first solution in the production tank, wherein the mixing may include moving the filtration member such that at least part of the filtration member is dipped in the first solution stored in the production tank.

In this case, the second solution can be easily mixed with the heated first solution. Thus, the processing liquid can be more efficiently produced.

(24) The substrate processing method may further include the step of stirring the processing liquid produced in the production tank.

In this case, the second solution is efficiently mixed with the first solution. Thus, the production of the processing liquid can be promoted.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 6 is a schematic diagram showing the operations of the substrate processing apparatus from the time point t11 to the time point t17 of FIG. 4;

FIG. 7 is a schematic diagram showing the operations of the substrate processing apparatus from the time point t11 to the time point t17 of FIG. 4;

Figure 8:
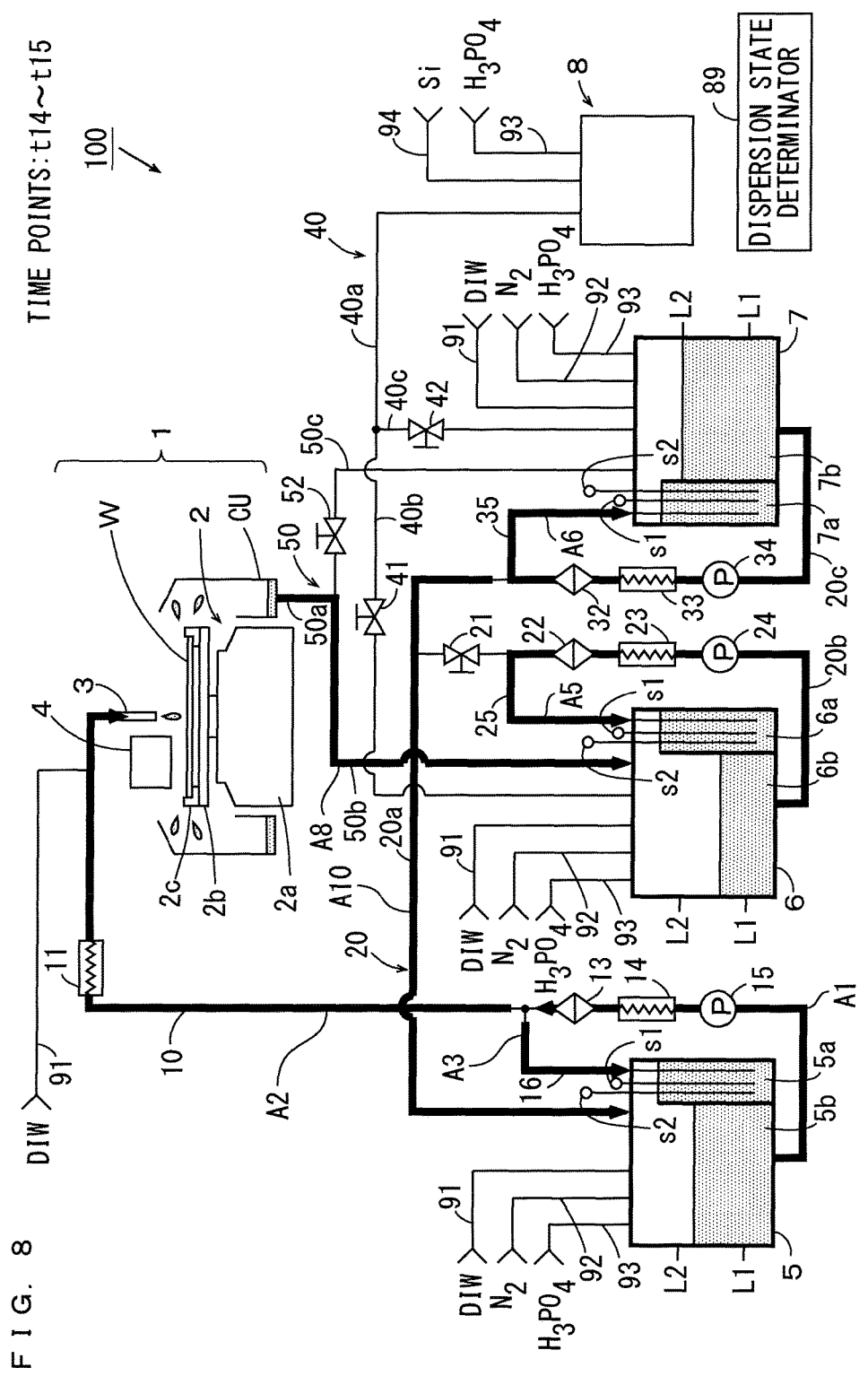

FIG. 8 is a schematic diagram showing the operations of the substrate processing apparatus from the time point t11 to the time point t17 of FIG. 4;

FIG. 9 is a schematic diagram showing the operations of the substrate processing apparatus from the time point t11 to the time point t17 of FIG. 4;

FIG. 10 is a schematic diagram showing a configuration of a substrate processing apparatus according to a second embodiment;

DESCRIPTION OF THE PREFERRED EMBODIMENTS

A substrate processing apparatus and a substrate processing method using the substrate processing apparatus according to one embodiment of the present invention will be described below with reference to drawings. In the following description, a substrate refers to a semiconductor wafer, a glass substrate for a liquid crystal display, a glass substrate for a PDP (Plasma Display Panel), a glass substrate for a photo-mask, a substrate for an optical disc, or the like.

A substrate processing apparatus according to the present embodiment is a single-substrate processing apparatus that processes substrates one by one. In the substrate processing apparatus, a high temperature phosphoric acid aqueous solution ($H_3PO_4+H_2O$) including silicon (Si) is supplied as an etching processing liquid to a substrate on which a silicone oxide film made of silicon oxide ($SiO_2$) and the like and a silicon nitride film made of silicon nitride ($Si_3N_4$) and the like are formed.

An etching rate of the high temperature phosphoric acid aqueous solution for the silicon nitride film is larger than an etching rate of the high temperature phosphoric acid aqueous solution for the silicon oxide film. Therefore, when the high temperature phosphoric acid aqueous solution is supplied to the substrate on which the silicon oxide film and the silicon nitride film are formed, the silicon nitride film is selectively removed from the substrate.

It is known that phosphoric acid concentration and silicon concentration in the phosphoric acid aqueous solution influence the etching rate for each of the silicon nitride film and the silicon oxide film. Therefore, it is necessary to appropriately manage the phosphoric acid concentration and the silicon concentration in the phosphoric acid aqueous solution in order to perform selective etching at a desired selective etching ratio (an etching amount of the silicon nitride film/an etching amount of the silicon oxide film).

In the following description, the phosphoric acid concentration, which the phosphoric acid aqueous solution supplied to the substrate is to have in order to etch the substrate at the desired selective etching ratio is referred to as reference phosphoric acid concentration. Similarly, the silicon concentration, which the phosphoric acid aqueous solution supplied to the substrate is to have in order to etch the substrate at the desired selective etching ratio is referred to as reference silicon concentration.

Further, a silicon containing liquid including silicon particles is used in a substrate processing apparatus, described below.

[1] First Embodiment (1) Configuration of Substrate Processing Apparatus

Figure 1:
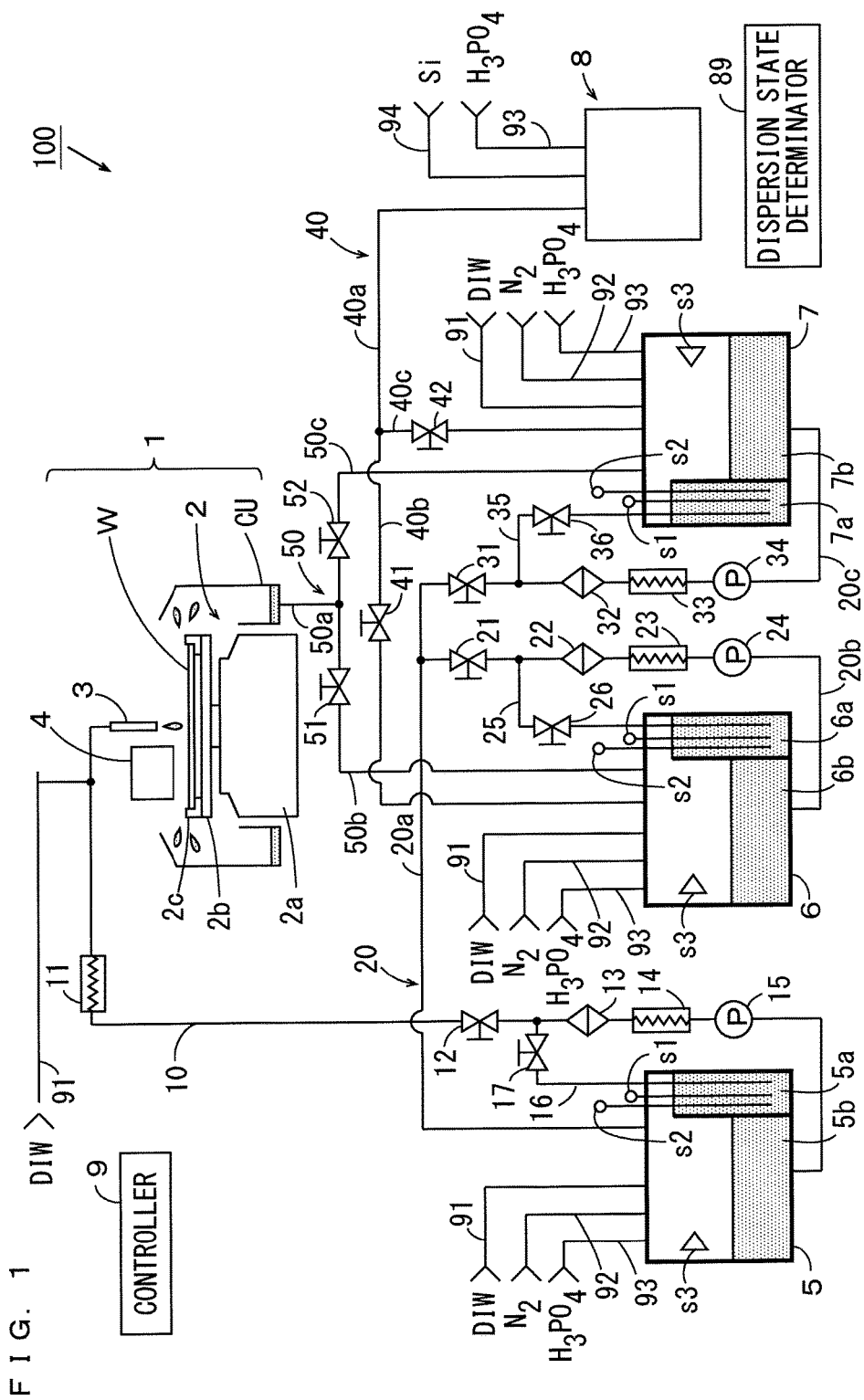
FIG. 1 is a schematic diagram showing a configuration of a substrate processing apparatus according to a first embodiment.

FIG. 1 is a schematic diagram showing the configuration of the substrate processing apparatus according to the first embodiment. As shown in FIG. 1, the substrate processing apparatus 100 mainly includes a processor 1, a first tank 5, a second tank 6, a third tank 7, a new liquid supply device 8, a controller 9 and a dispersion state determinator 89. Further, the processor 1 includes a spin chuck 2, a processing liquid nozzle 3, a heating device 4 and a cup CU. In the processor 1, the plurality of substrates W are sequentially processed one by one.

The spin chuck 2 has a spin motor 2a, a spin base 2b and a plurality of chuck pins 2c. The spin motor 2a is provided such that a rotation shaft is parallel to a vertical direction. The spin base 2a has a disc shape and is attached to an upper end of the rotation shaft of the spin motor 2a in a horizontal attitude. The plurality of chuck pins 2c are provided on an upper surface of the spin base 2b, and hold a peripheral edge of the substrate W. The spin motor 2a is operated with the plurality of chuck pins 2c holding the substrate W. Thus, the substrate W is rotated about a vertical axis.

While the mechanical spin chuck 2 holding the peripheral edge of the substrate W is used in the present example as described above, the invention is not limited to this. A suction-type spin chuck that holds a lower surface of the substrate W by suction may be used instead of the mechanical spin chuck.

The processing liquid nozzle 3 and the heating device 4 are provided to be movable between a position above the substrate W held by the spin chuck 2 and a waiting position beside the substrate W. The processing liquid nozzle 3 supplies the phosphoric acid aqueous solution supplied from the first tank 5 to the substrate W rotated by the spin chuck 2.

When the phosphoric acid aqueous solution is supplied from the processing liquid nozzle 3 to the substrate W, the heating device 4 is arranged at a position opposite to an upper surface of the substrate W. The heating device 4 includes a lamp heater that generates infrared rays, and heats the substrate W and the phosphoric acid aqueous solution supplied to the upper surface of the substrate W by heat of radiation. For example, a tungsten-halogen lamp, a xenon arc lamp, a graphite heater or the like can be used as the lamp heater.

A heating temperature of the substrate W by the heating device 4 is set higher than a boiling point corresponding to the phosphoric acid concentration of the phosphoric acid aqueous solution (not less than 140° C. and not more than 160° C., for example). Thus, a temperature of the phosphoric acid aqueous solution on the substrate W is increased to the boiling point corresponding to the phosphoric acid concentration, and the etching rate of the silicon nitride film by the phosphoric acid aqueous solution is increased.

On the other hand, when the silicon concentration in the phosphoric acid aqueous solution is within an appropriate range, an etching rate of the silicone oxide film by the phosphoric acid aqueous solution is kept sufficiently lower than an etching rate of the silicon nitride film. As a result, the silicon nitride film on the substrate W is selectively etched as described above.

The cup CU is provided to surround the spin chuck 2. The cup CU is lowered at a time of carrying of the substrate W into the spin chuck 2 and a time of carrying of the substrate W out from the spin chuck 2, and is lifted at a time of supply of the phosphoric acid aqueous solution to the substrate W.

At the time of supply of the phosphoric acid aqueous solution to the rotating substrate W, an upper end of the cup CU is located at a position further upward than the substrate W. Thus, the phosphoric acid aqueous solution being shaken off from the substrate W is caught by the cup CU. The phosphoric acid aqueous solution being caught by the cup CU is sent to the second tank 6 or the third tank 7 as described below.

The first tank 5 includes a circulation tank 5a and a storage tank 5b. The circulation tank 5a and the storage tank 5b are arranged to be adjacent to each other, and are configured such that an overflowing liquid from one tank (the circulation tank 5a, for example) flows into the other tank (the storage tank 5b, for example). A phosphoric acid concentration meter s1 and a silicon concentration meter s2 are provided in the circulation tank 5a. The phosphoric acid concentration meter s1 measures the phosphoric acid concentration of the phosphoric acid aqueous solution, and the silicon concentration meter s2 measures the silicon concentration of the phosphoric acid aqueous solution. A liquid surface sensor s3 that detects a height of a liquid surface of the phosphoric acid aqueous solution is provided in the storage tank 5b. A DIW (Deionized Water) supply system 91, a nitrogen ($N_2$) gas supply system 92 and a phosphoric acid aqueous solution supply system 93 are connected to the storage tank 5b.

A first supply pipe 10 is provided to connect the storage tank 5b of the first tank 5 to the processing liquid nozzle 3 of the processor 1. A pump 15, a heater 14, a filter 13, a valve 12 and a heater 11 are inserted into the first supply pipe 10 in this order from the storage tank 5b towards the processing liquid nozzle 3.

A circulation pipe 16 is provided to connect a portion, of the first supply pipe 10, that is located between the filter 13 and the valve 12 to the circulation tank 5a. A valve 17 is inserted into the circulation pipe 16. Further, the DIW supply system 91 is connected to a portion, of the first supply pipe 10, that is located between the heater 11 and the processing liquid nozzle 3.

Each of the second and third tanks 6, 7 has the same configuration as the first tank 5, and includes each of circulation tanks 6a, 7a and each of storage tanks 6b, 7b. A phosphoric acid concentration meter s1 and a silicon concentration meter s2 are provided in each of the circulation tanks 6a, 7a. A liquid surface sensor s3 is provided in each of the storage tanks 6b, 7b, and a DIW supply system 91, a nitrogen gas supply system 92 and a phosphoric acid aqueous solution supply system 93 are connected to each of the storage tanks 6b, 7b.

A second supply pipe 20 is provided to connect the storage tank 5b of the first tank 5 to each of the storage tanks 6b, 7b of each of the second and third tanks 6, 7. The second supply pipe 20 has one main pipe 20a and two branch pipes 20b, 20c. The branch pipes 20b, 20c are connected to the main pipe 20a. The main pipe 20a is connected to the storage tank 5b of the first tank 5, and the two branch pipes 20b, 20c are respectively connected to the storage tanks 6b, 7b of the respective second and third tanks 6, 7.

A pump 24, a heater 23, a filter 22 and a valve 21 are inserted into the one branch pipe 20b in this order from the storage tank 6b towards the main pipe 20a. A circulation pipe 25 is provided to connect a portion, of the branch pipe 20b, that is located between the filter 22 and the valve 21 to the circulation tank 6a. A valve 26 is inserted into the circulation pipe 25.

A pump 34, a heater 33, a filter 32 and a valve 31 are inserted into the other branch pipe 20c in this order from the storage tank 7b towards the main pipe 20a. A circulation pipe 35 is provided to connect a portion, of the branch pipe 20c, that is located between the filter 32 and the valve 31 to the circulation tank 7a. A valve 36 is inserted into the circulation pipe 35.

A collection pipe 50 is provided to connect the cup CU of the processor 1 to each of the storage tanks 6b, 7b of each of the second and third tanks 6, 7. The collection pipe 50 has one main pipe 50a and two branch pipes 50b, 50c. The branch pipes 50b, 50c are connected to the main pipe 50a. The main pipe 50a of the collection pipe 50 is connected to the cup CU, and the two branch pipes 50b, 50c are respectively connected to the storage tanks 6b, 7b of the respective second and third tanks 6, 7. A valve 51 is inserted into the branch pipe 50b, and a valve 52 is inserted into the branch pipe 50c.

A third supply pipe 40 is provided to connect the new liquid supply device 8 to each of the storage tanks 6b, 7b of each of the second and third tanks 6, 7. The third supply pipe 40 has one main pipe 40a and two branch pipes 40b, 40c. The branch pipes 40b, 40c are connected to the main pipe 40a. The main pipe 40a of the third supply pipe 40 is connected to the new liquid supply device 8, and the two branch pipes 40b, 40c are respectively connected to the storage tanks 6b, 7b of the respective second and third tanks 6, 7. A valve 41 is inserted into the branch pipe 40b, and a valve 42 is inserted into the branch pipe 40c.

Figure 2:
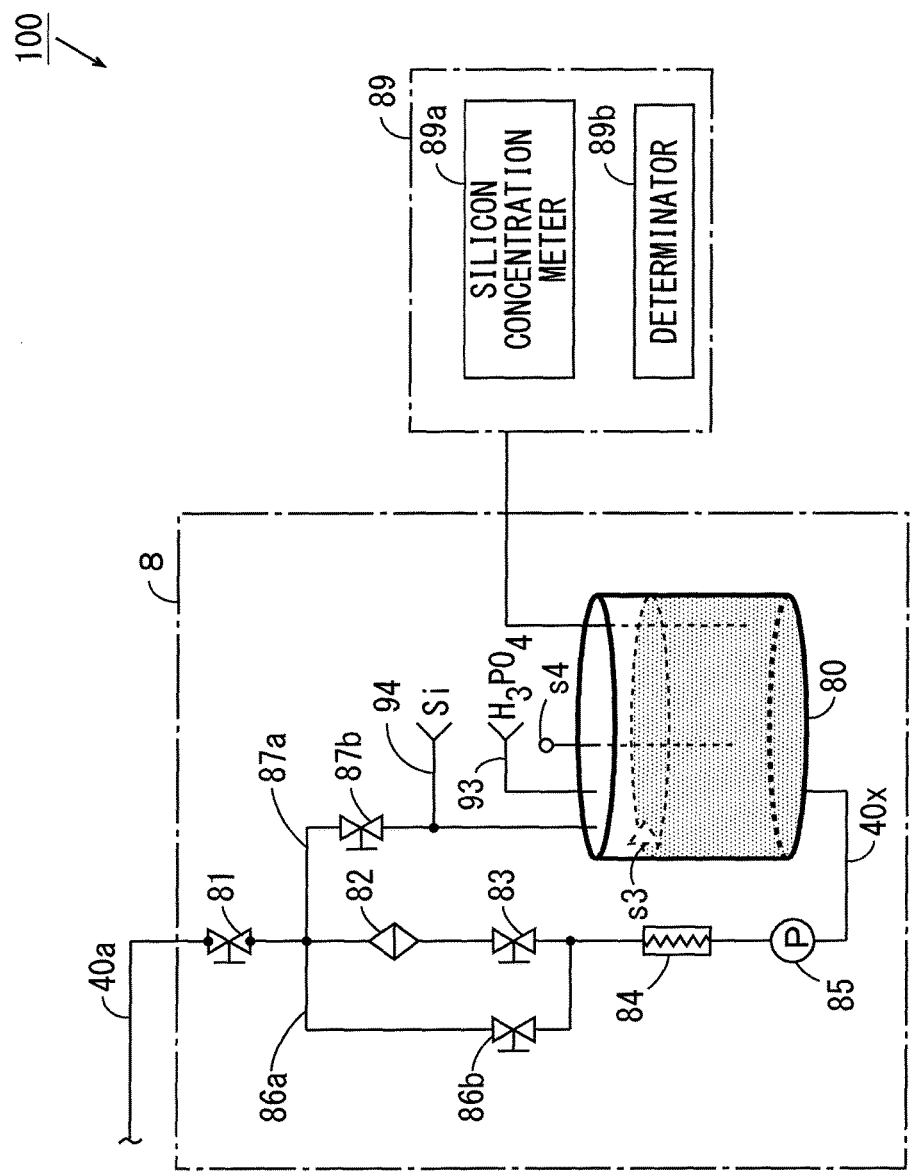
FIG. 2 is a block diagram showing configurations of a new liquid supply device and a dispersion state determinator of FIG. 1.

FIG. 2 is a block diagram showing the configurations of the new liquid supply device 8 and the dispersion state determinator 89 of FIG. 1. As shown in FIG. 2, the new liquid supply device 8 includes a production tank 80 having a cylindrical sidewall. The end of the main pipe 40a of the third supply pipe 40 is connected to a valve 81. A coupling pipe 40x is provided to connect the valve 81 to the production tank 80. A pump 85, a heater 84, a valve 83 and a filter 82 are inserted into the coupling pipe 40x in this order from the production tank 80 towards the valve 81.

A bypass pipe 86a is provided to connect a portion, of the coupling pipe 40x, that is located between the heater 84 and the valve 83 to a portion, of the coupling pipe 40x, that is located between the filter 82 and the valve 81. A valve 86b is inserted into the bypass pipe 86a.

A circulation pipe 87a is provided to connect a portion, of the coupling pipe 40x, that is located between the filter 82 and the valve 81 to the production tank 80. A valve 87b is inserted into the circulation pipe 87a. Further, a silicon containing liquid supply system 94 is connected to a portion, of the circulation pipe 87a, that is located between the valve 87b and the production tank 80. Further, a liquid surface sensor s3 and a temperature sensor s4 are provided in the production tank 80, and the phosphoric acid aqueous solution supply system 93 is connected to the production tank 80.

The silicon containing liquid supply system 94 includes a constant delivery pump that discharges a constant amount (5 cc, for example) of the silicon containing liquid to the circulation pipe 87a. When an amount larger than the constant amount of the silicon containing liquid is supplied to the production tank 80, the constant amount of the silicon containing liquid is discharged to the circulation pipe 87a a number of times.

In the production tank 80 of the new liquid supply device 8, the phosphoric acid aqueous solution and the silicon containing liquid supplied from the phosphoric acid aqueous solution supply system 93 and the silicon containing liquid supply system 94 are mixed. An amount of the phosphoric acid aqueous solution and an amount of the silicon containing liquid mixed in the new liquid supply device 8 are suitably adjusted. Thus, in the new liquid supply device 8, the phosphoric acid aqueous solution having any silicon concentration is produced as a new processing liquid. The produced phosphoric acid aqueous solution is supplied to the second tank 6 or the third tank 7.

The silicon containing liquid is made of the silicon particles, an organic solvent and pure water. The silicon particles having a particle diameter of about 15 nm can be used as the silicon particles. Further, methanol can be used as the organic solvent.

The organic solvent is added to the silicon containing liquid by about 0.1%, for example. The organic solvent has a function of preventing aggregation of the silicon particles when the silicon containing liquid is supplied to the phosphoric acid aqueous solution.

The dispersion state determinator 89 has a silicon concentration meter 89a and a determinator 89b, and is connected to the new liquid supply device 8. The silicon concentration meter 89a samples part of the phosphoric acid aqueous solution stored in the production tank 80, and measures the silicon concentration in the sampled phosphoric acid aqueous solution. The sampling of the phosphoric acid aqueous solution and the measurement of the silicon concentration by the silicon concentration meter 89a are performed in a predetermined sampling period (5 min, for example).

The determinator 89 is constituted by a CPU (Central Processing Unit) and a memory, or a microcomputer, for example, and has a timing function. When the silicon containing liquid is supplied to the production tank 80, the determinator 89b determines whether the silicon particles included in the supplied silicon containing liquid are uniformly dispersed in the phosphoric acid aqueous solution stored in the production tank 80. The reason for the determination whether the silicon particles are uniformly dispersed and details of the determination process by the determinator 89b are described below.

The controller 9 of FIG. 1 is constituted by a CPU (Central Processing Unit) and a memory, or a microcomputer and the like. A system program is stored in the memory of the controller 9. The controller 9 controls an operation of each constituent element of the substrate processing apparatus 100.

For example, the controller 9 switches each valve 12, 17, 21, 26, 31, 36, 41, 42, 51, 52 between an open state and a close state based on the height of the liquid surface detected by each liquid surface sensor s3. Further, the controller 9 controls the DIW supply system 91, the nitrogen gas supply system 92 and the phosphoric acid aqueous solution supply system 93 based on the phosphoric acid concentration measured by each phosphoric acid concentration meter s1. Further, the controller 9 controls the new liquid supply device 8, the phosphoric acid aqueous solution supply system 93 and the silicon containing liquid supply system 94 based on the silicon concentration measured by each silicon concentration meter s2.

Further, the controller 9 switches each of the valves 81, 83, 86b, 87b of FIG. 2 between an open state and a close state based on a result of determination by the dispersion state determinator 89 of FIG. 2. The controller 9 may perform the same determination process as the determination process by the determinator 89b of the dispersion state determinator 89. In this case, the determinator 89b does not have to be provided in the dispersion state determinator 89.

(2) Reason for Determination Whether Silicon Particles Are Uniformly Dispersed

When the new processing liquid is produced in the new liquid supply device 8 of FIG. 2, an amount of the processing liquid to be produced and the silicon concentration to be targeted (hereinafter referred to as target silicon concentration) are determined before the production. Thus, an amount of the phosphoric acid aqueous solution and an amount of the silicon containing liquid to be supplied to the production tank 80 are calculated, and calculated amounts of the phosphoric acid aqueous solution and the silicon containing liquid are supplied to the production tank 80.

Suppose that the phosphoric acid aqueous solution is circulated through the production tank 80, the coupling pipe 40x and the circulation pipe 87a of FIG. 2 in order to dissolve the silicon particles in the silicon containing liquid in the phosphoric acid aqueous solution stored in the production tank 80. In this case, the phosphoric acid aqueous solution stored in the production tank 80 is sucked by the pump 85 in the coupling pipe 40x, and is sent to the filter 82 after being heated by the heater 84.

Right after the silicon containing liquid is supplied to the phosphoric acid aqueous solution, the silicon particles are not uniformly dispersed in the phosphoric acid aqueous solution stored in the production tank 80. Therefore, aggregates of the locally concentrated silicon particles are caught by the filter 82. In this case, clogging occurs in the filter 82. Further, the silicon particles caught by the filter 82 are unlikely to be dissolved in the phosphoric acid aqueous solution. Thus, the phosphoric acid aqueous solution having the target silicon concentration cannot be supplied to the second tank 6 or the third tank 7.

In the present embodiment, the phosphoric acid aqueous solution is sent to the bypass pipe 86a after being heated by the heater 84 in the coupling pipe 40x in a time period from the supply of the silicon containing liquid to the production tank 80 is started until the silicon particles are uniformly dispersed in the production tank 80. In this case, the phosphoric acid aqueous solution bypasses the filter 82 by the bypass pipe 86a to be sent to the circulation pipe 87a and is returned to the production tank 80. Thus, the aggregates of the locally concentrated silicon particles are not caught by the filter 82.

Thereafter, after the silicon particles are uniformly dispersed in the production tank 80, circulation paths for the phosphoric acid aqueous solution are switched such that the phosphoric acid aqueous solution flows through the filter 82. Thus, the uniformly dispersed silicon particles pass through the filter 82 without being caught, and only impurities are caught by the filter 82. In this manner, in the present embodiment, whether the silicon particles are uniformly dispersed is determined in order to acquire timing for switching the circulation paths of the phosphoric acid aqueous solution.

Figure 3:
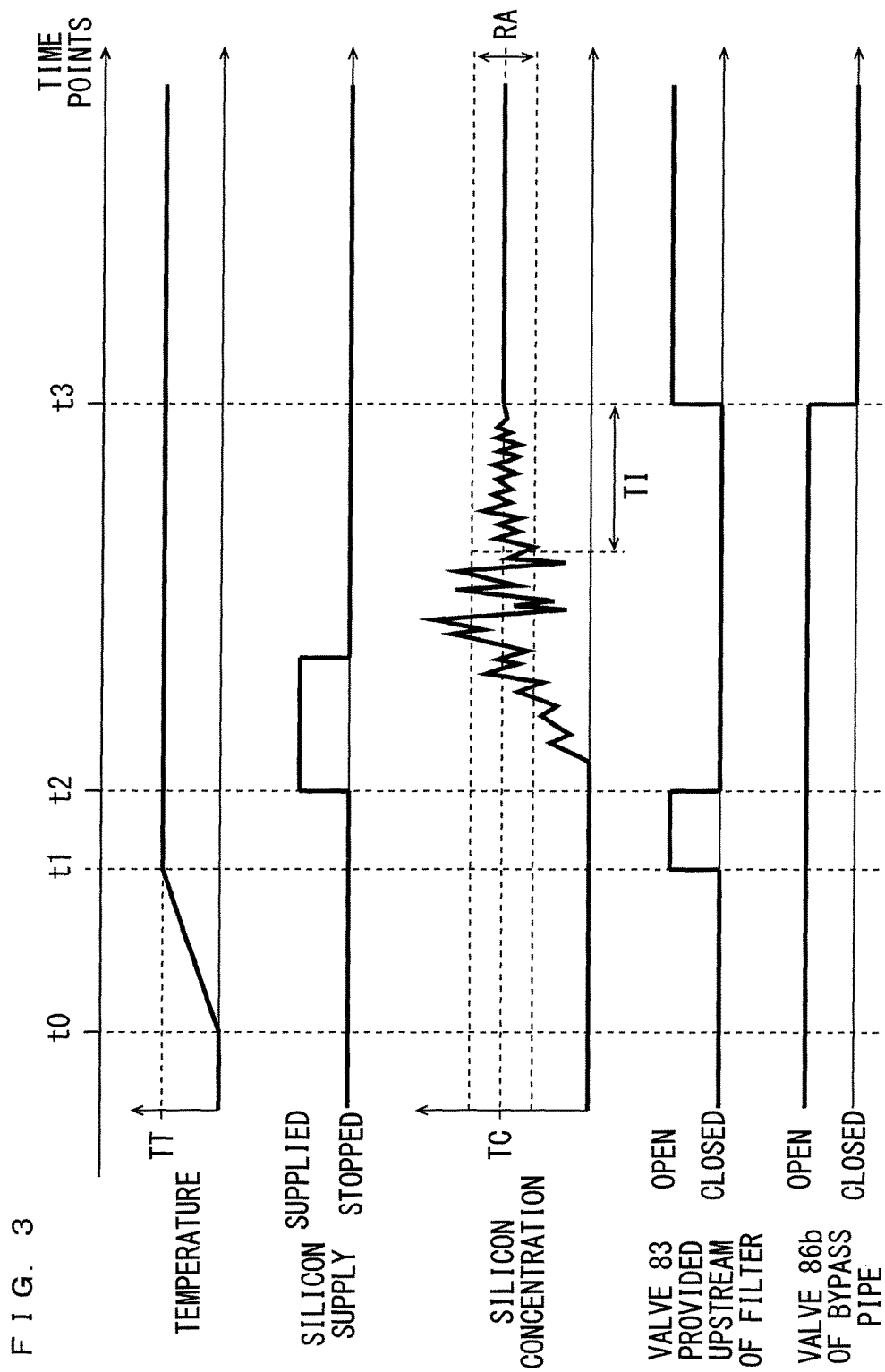
FIG. 3 is a time chart showing an operation of when a phosphoric acid aqueous solution having target silicon concentration is produced in the new liquid supply device.

(3) Specific Production Example of Phosphoric Acid Aqueous Solution Having Target Silicon Concentration The specific production examples of the phosphoric acid aqueous solution having the target silicon concentration will be described. FIG. 3 is a time chart showing the operation of when the phosphoric acid aqueous solution having the target silicon concentration is produced in the new liquid supply device 8.

In FIG. 3, temperatures of the phosphoric acid aqueous solution in the production tank 80 of FIG. 2 are shown in a top field. In the graph of the top field, the ordinate indicates the temperature of the phosphoric acid aqueous solution. Further, supply timing for the silicon containing liquid supplied from the silicon containing liquid supply system 94 to the circulation pipe 87a of FIG. 2 is shown in the second field from the top. Further, the measurement values of the silicon concentration by the silicon concentration meter 89a of FIG. 2 are shown in the third field from the top. In the graph of the third field from the top, the ordinate indicates the silicon concentration in the phosphoric acid aqueous solution. Further, the open state and the close state of each of the valves 83, 86b of FIG. 2 are respectively shown in the fourth and fifth fields from the top.

In an initial state, the phosphoric acid aqueous solution is stored in the production tank 80. An amount of the phosphoric acid aqueous solution is calculated based on the amount of the processing liquid to be produced and the target silicon concentration. The amount of the phosphoric acid aqueous solution stored in the production tank 80 is adjusted based on the height of the liquid surface detected by the liquid surface sensor s3 of FIG. 2, for example.

Further, in the initial state, the pump 85 of FIG. 2 is operated, the valves 86b, 87b of FIG. 2 are open, and the valves 81, 83 of FIG. 2 are closed. Further, an electric current is not supplied to the heater 84 of FIG. 2. Thus, the room temperature phosphoric acid aqueous solution flows through the production tank 80, the coupling pipe 40x, the bypass pipe 86a and the circulation pipe 87a of FIG. 2.

At a time point t0, the electric current is supplied to the heater 84 of FIG. 2, and heating of the phosphoric acid aqueous solution by the heater 84 is started. In this case, the phosphoric acid aqueous solution is circulated through the production tank 80, the coupling pipe 40x and the circulation pipe 87a, so that the temperature of the entire phosphoric acid aqueous solution in the production tank 80 is increased.

Thereafter, when the temperature of the phosphoric acid aqueous solution in the production tank 80 reaches a predetermined threshold value temperature TT at a time point t1, the valve 83 of FIG. 2 is open. The temperature of the phosphoric acid aqueous solution is measured by the temperature sensor s4 of FIG. 2. The threshold value temperature TT is set to about 150° C., for example.

In this case, the phosphoric acid aqueous solution having the threshold value temperature TT flows through the filter 82 of FIG. 2. Thus, the filter 82 is heated by the phosphoric acid aqueous solution. At this time, the silicon particles are not present in the phosphoric acid aqueous solution, so that clogging of the filter 82 due to the silicon particles does not occur.

At a time point t2 at which a constant time period has elapsed since the time point t1, the valve 83 of FIG. 2 is closed. Thus, the filter 82 of FIG. 2 is bypassed by the bypass pipe 86a. Further, at the time point t2, the silicon containing liquid is supplied to the production tank 80 from the silicon containing liquid supply system 94 of FIG. 2. The amount of the supplied silicon containing liquid at this time is calculated in advance based on the amount of the processing liquid to be produced and the target silicon concentration as described above.

As described above, right after the silicon containing liquid is supplied to the phosphoric acid aqueous solution, the silicon particles are not uniformly dispersed in the production tank 80. Therefore, right after the time point t2, large variations occur in the silicon concentration in the phosphoric acid aqueous solution sampled by the silicon concentration meter 89a.

Thereafter, when the circulation of the phosphoric acid aqueous solution is continued after the silicon containing liquid is supplied, the phosphoric acid aqueous solution is stirred as the time elapses, and the silicon particles are uniformly dispersed. Thus, variations in measurement value of the silicon concentration by the silicon concentration meter 89a are reduced.

Therefore, the determinator 89b of FIG. 2 determines whether the measurement value is in an allowable range RA with the target silicon concentration TC being at the center every time the measurement of the silicon concentration by the silicon concentration meter 89a is performed. Further, the determinator 89b determines whether the measurement value being in the allowable range RA has continued for a predetermined time period TI. Finally, in a case in which the measurement value being in the allowable range RA has continued for the predetermine time period TI, the determinator 89b determines that the silicon particles are uniformly dispersed.

At a time point t3, when the uniform dispersion of the silicon particles is determined by the dispersion state determinator 89 of FIG. 2, the valve 83 of FIG. 2 is open, and the valve 86b of FIG. 2 is closed. Thus, the phosphoric acid aqueous solution flows in the production tank 80, the coupling pipe 40x and the circulation pipe 87a of FIG. 2.

At this time, the phosphoric acid aqueous solution flows in the heater 84 of FIG. 2, so that a temperature of the phosphoric acid aqueous solution stored in the production tank 80 is kept at the threshold value temperature TT. Further, the phosphoric acid aqueous solution flows through the filter 82 of FIG. 2, so that impurities included in the phosphoric acid aqueous solution are removed.

As described above, the phosphoric acid aqueous solution heated by the heater 84 flows through the filter 82 of FIG. 2 in a period from the time point t1 to the time point t2 before a silicon containing liquid is supplied. Thus, the filter 82 is heated in advance. Therefore, a reduction in temperature of the phosphoric acid aqueous solution flowing through the filter 82 at the time point t3 is prevented.

After it passes the time point t3, with the phosphoric acid aqueous solution flowing in the production tank 80, the coupling pipe 40x and the circulation pipe 87a, the valve 81 of FIG. 2 is open. Thus, the phosphoric acid aqueous solution adjusted to the target silicon concentration in the production tank 80 is supplied to the second tank 6 or the third tank 7 of FIG. 1 through the main pipe 40a.

As described above, in the present example, the phosphoric acid aqueous solution is not sent to the filter 82 of FIG. 2 after the silicon containing liquid is supplied unless the uniform dispersion of the silicon particles is determined. Thus, aggregates of the locally concentrated silicon particles are not caught by the filter 82 after the silicon containing liquid is supplied. Therefore, clogging of the filter 82 due to the silicon particles is prevented. Further, the phosphoric acid aqueous solution is circulated through the coupling pipe 40x, the bypass pipe 86a and the circulation pipe 87a, so that the phosphoric acid aqueous solution is stirred. Thus, the silicon particles in the phosphoric acid aqueous solution are uniformly dispersed in a short period of time.

Thereafter, when it is determined that the silicon particles in the silicon containing liquid are uniformly dispersed in the phosphoric acid aqueous solution, the phosphoric acid aqueous solution flows through the filter 82. At this time, the silicon particles dispersed in the phosphoric acid aqueous solution are not caught by the filter 82. Thus, all of the silicon particles supplied to the phosphoric acid aqueous solution can be dissolved in the phosphoric acid aqueous solution. In this manner, the silicon concentration of the phosphoric acid aqueous solution can be accurately and uniformly adjusted to the target silicon concentration.

In the present embodiment, after it passes the time point t3, adjustment of the silicon concentration in the production tank 80 may be performed based on the measurement value of the silicon concentration by the silicon concentration meter 89a of FIG. 2. Even during this adjustment, in a case in which the silicon containing liquid is supplied to the production tank 80, the phosphoric acid aqueous solution is not sent to the filter 82 in a period from the supply of the silicon containing liquid until the silicon particles are uniformly dispersed.

(4) Operation of Substrate Processing Apparatus

Figure 4:
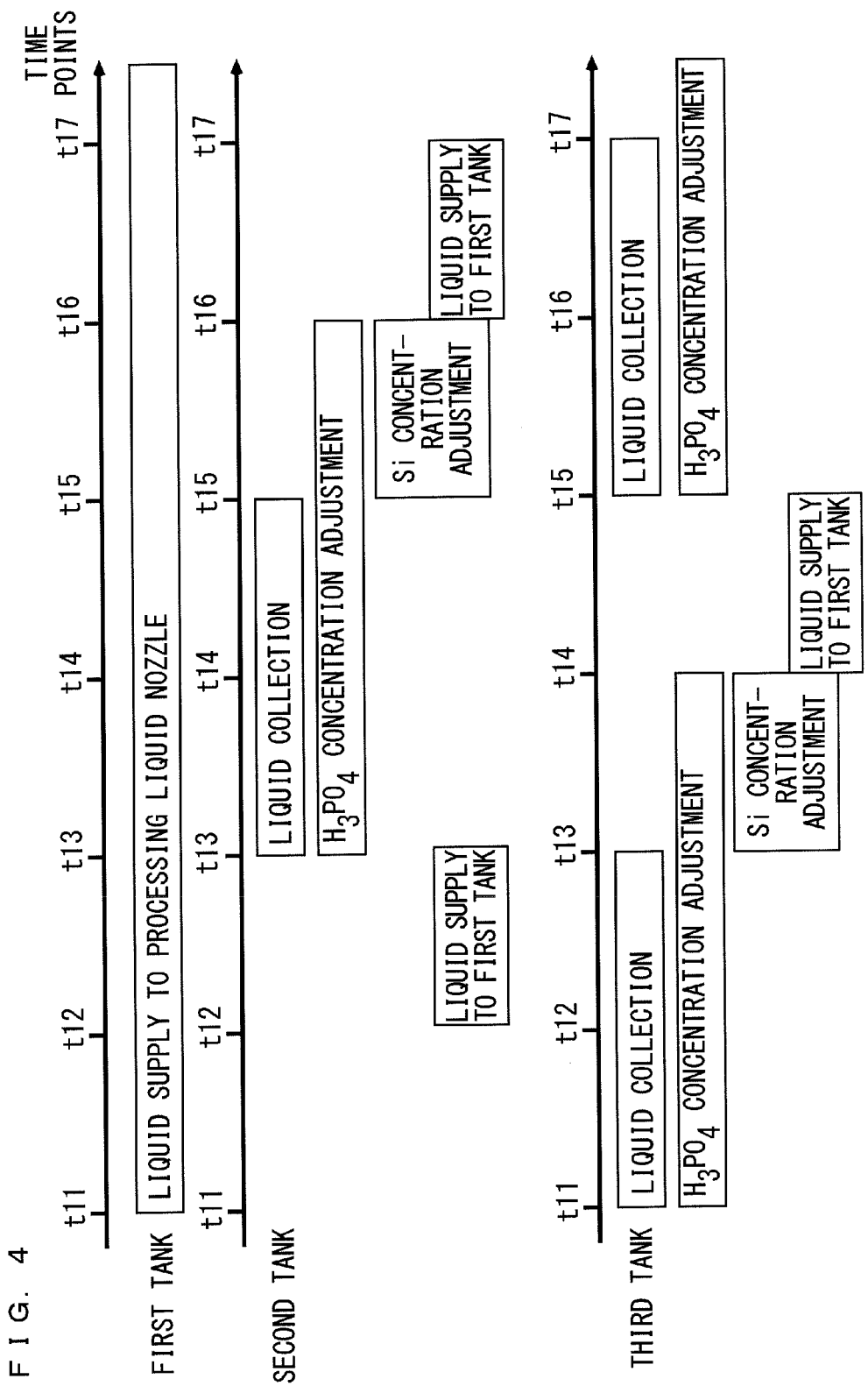
FIG. 4 is a time chart showing contents of operations respectively related to first, second and third tanks of FIG. 1.

A series of operations of the substrate processing apparatus 100 performed when the plurality of substrates W are processed by the processor 1 will be described. FIG. 4 is a time chart showing the contents of operations respectively related to the first, second and third tanks 5, 6, 7 of FIG. 1. FIGS. 5 to 9 are schematic views showing the operations of the substrate processing apparatus 100 from a time point t11 to a time point t17 of FIG. 4. In the following description, the operations in the new liquid supply device 8 of FIG. 2 are not described.

In the first, second and third tanks 5, 6, 7, a first reference height L1 and a second reference height L2 are set in each of the storage tanks 5b, 6b, 7b. The first reference height L1 is set in the vicinity of a bottom portion of each of the storage tanks 5b, 6b, 7b, and the second reference height L2 is set higher than the first reference height L1 and in the vicinity of an upper end of each of the storage tanks 5b, 6b, 7b.

The first reference height L1 is set to a height of the liquid surface of when about one fifth of the maximum capacity of each storage tank 5b, 6b, 7b of liquid is stored in each storage tank 5b, 6b, 7b, for example. Further, the second reference height L2 is set to the height of the liquid surface when about four fifth of the maximum capacity of each storage tank 5b, 6b, 7b of liquid is stored in each storage tank 5b, 6b, 7b, for example.

In the initial state, the phosphoric acid aqueous solution having the reference phosphoric acid concentration and the reference silicon concentration is stored in each of the first and second tanks 5, 6. In each of the first and second tanks 5, 6, the height of the liquid surface of the phosphoric acid aqueous solution is kept at the second reference height L2.

Further, the phosphoric acid aqueous solution that does not have the reference phosphoric acid concentration and the reference silicon concentration is stored in the third tank 7. In the third tank 7, the height of the liquid surface of the phosphoric acid aqueous solution is kept at the first reference height L1. The valves 12, 17, 21, 26, 31, 36, 41, 42, 51, 52 of FIG. 1 are closed.

When the substrate processing apparatus 100 is turned on from the initial state, operations of the heaters 11, 14, 23, 33, the pumps 15, 24, 34 and the new liquid supply device 8 of FIG. 1 are started. In this state, the first substrate W is carried into the spin chuck 2 of the processor 1. Further, the substrate W is held and rotated by the spin chuck 2.

At the subsequent time point t11 of FIG. 4, the controller 9 of FIG. 1 opens the valves 12, 17 of FIG. 1. Thus, as indicated by a thick arrow A1 in FIG. 5, the phosphoric acid aqueous solution in the storage tank 5b is sucked by the pump 15, and is sent to the filter 13 through the heater 14.

The heater 14 heats the phosphoric acid aqueous solution flowing in the first supply pipe 10 to a predetermined temperature (150° C., for example). The filter 13 removes impurities by filtering the phosphoric acid aqueous solution.

Figure 5:
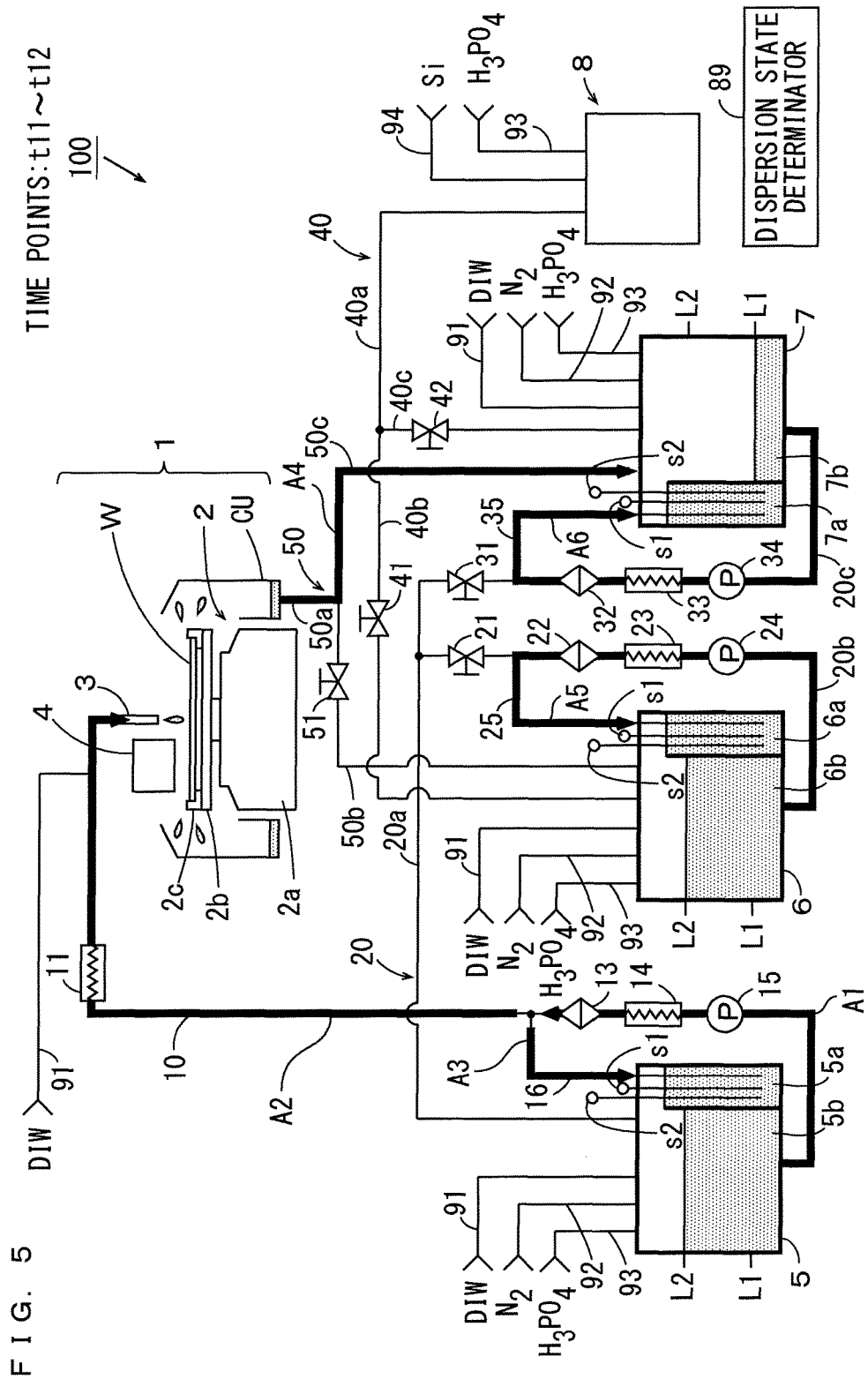
FIG. 5 is a schematic diagram showing operations of the substrate processing apparatus from a time point t11 to a time point t17 of FIG. 4.

As indicated by a thick arrow A2 in FIG. 5, part of the phosphoric acid aqueous solution that has passed through the heater 14 and the filter 13 is sent to the processing liquid nozzle 3 while being further heated by the heater 11. Thus, the phosphoric acid aqueous solution having the reference phosphoric acid concentration and the reference silicon concentration is supplied to the substrate W from the processing liquid nozzle 3. The DIW is suitably supplied from the DIW supply system 91 to a portion located between the heater 11 and the processing liquid nozzle 3. The supply of the phosphoric acid aqueous solution from the first tank 5 to the processing liquid nozzle 3 is continued until the process for the substrate W is finished as shown in FIG. 4.

On the other hand, as indicated by a thick arrow A3 in FIG. 5, the rest of the phosphoric acid aqueous solution that has passed through the heater 14 and the filter 13 is returned to the circulation tank 5a of the first tank 5 through the circulation pipe 16. In the first tank 5, the phosphoric acid aqueous solution overflowing from the circulation tank 5a flows into the storage tank 5b. In this manner, the phosphoric acid aqueous solution in the storage tank 5b passes through the first supply pipe 10, the circulation pipe 16 and the circulation tank 5a while being heated and filtered to return to the storage tank 5b. Thus, the temperature and cleanliness of the phosphoric acid aqueous solution in the storage tank 5b are kept substantially constant.

As described above, an operation of keeping temperature and cleanliness of the phosphoric acid aqueous solution in the storage tank constant by heating and filtering of part of the phosphoric acid aqueous solution stored in the storage tank 5b and returning of the part of the phosphoric acid aqueous solution to the storage tank 5b again is referred to as a circulation temperature control.

At the time point t11, the controller 9 further opens the valve 52 of FIG. 1. Thus, as indicated by a thick arrow A4 in FIG. 5, the used phosphoric acid aqueous solution collected by the cup CU of the processor 1 is sent to the storage tank 7b of the third tank 7 through the main pipe 50a and the branch pipe 50c. In this manner, an operation of sending the used phosphoric acid aqueous solution that has been supplied to the substrate W to the storage tank 7b is referred to as a liquid collection.

At the time point t11, the controller 9 further opens the valves 26, 36 of FIG. 1. Thus, as indicated by thick arrows A5, A6 in FIG. 5, the circulation temperature control similar to the first tank 5 is also performed in the second tank 6 and the third tank 7. The circulation temperature control in the first tank 5, the second tank 6 and the third tank 7 is continued until the process for the substrate W is finished.

When the liquid collection and the circulation temperature control are performed in the third tank 7, the phosphoric acid concentration of the phosphoric acid aqueous solution stored in the storage tank 7b is different from the reference phosphoric acid concentration. Therefore, the controller 9 controls the DIW supply system 91, the nitrogen gas supply system 92 and the phosphoric acid aqueous solution supply system 93 based on the measurement value of the phosphoric acid concentration meter s1 of the third tank 7 such that the phosphoric acid concentration in the storage tank 7b becomes close to the reference phosphoric acid concentration.

For example, when the measurement value from the phosphoric acid concentration meter s1 is higher than the reference phosphoric acid concentration, the controller 9 controls the DIW supply system 91 such that the DIW is supplied to the storage tank 7b. Thus, the phosphoric acid concentration in the storage tank 7b is reduced to be adjusted to the reference phosphoric acid concentration.

Further, when the measurement value from the phosphoric acid concentration meter s1 is lower than the reference phosphoric acid concentration, the controller 9 controls the phosphoric acid aqueous solution supply system 93 such that the phosphoric acid aqueous solution having the phosphoric acid concentration higher than the reference phosphoric acid concentration is supplied to the storage tank 7b. Thus, the phosphoric acid concentration in the storage tank 7b is increased to be adjusted to the reference phosphoric acid concentration.

Further, when the measurement value from the phosphoric acid concentration meter s1 is lower than the reference phosphoric acid concentration, the controller 9 controls the nitrogen gas supply system 92 such that a nitrogen gas is supplied to the storage tank 7b. In this case, evaporation of the phosphoric acid aqueous solution in the storage tank 7b is promoted. Thus, the phosphoric acid concentration in the storage tank 7b is increased to be adjusted to the reference phosphoric acid concentration.

The controller 9 may supply one of the phosphoric acid aqueous solution having the high phosphoric acid concentration and the nitrogen gas to the storage tank 7b, or may supply both to the storage tank 7b in order to increase the phosphoric acid concentration in the storage tank 7b.

As described above, an operation of adjusting the phosphoric acid concentration of the phosphoric acid aqueous solution in the storage tank 7b to the reference phosphoric acid concentration is referred to as a phosphoric acid concentration adjustment.

It is detected by the liquid surface sensor s3 at a time point t12 that the height of the liquid surface in the storage tank 5b of the first tank 5 is lowered by a predetermined height from the second reference height. In this case, the controller 9 opens the value 21 of FIG. 1.

Figure 6:
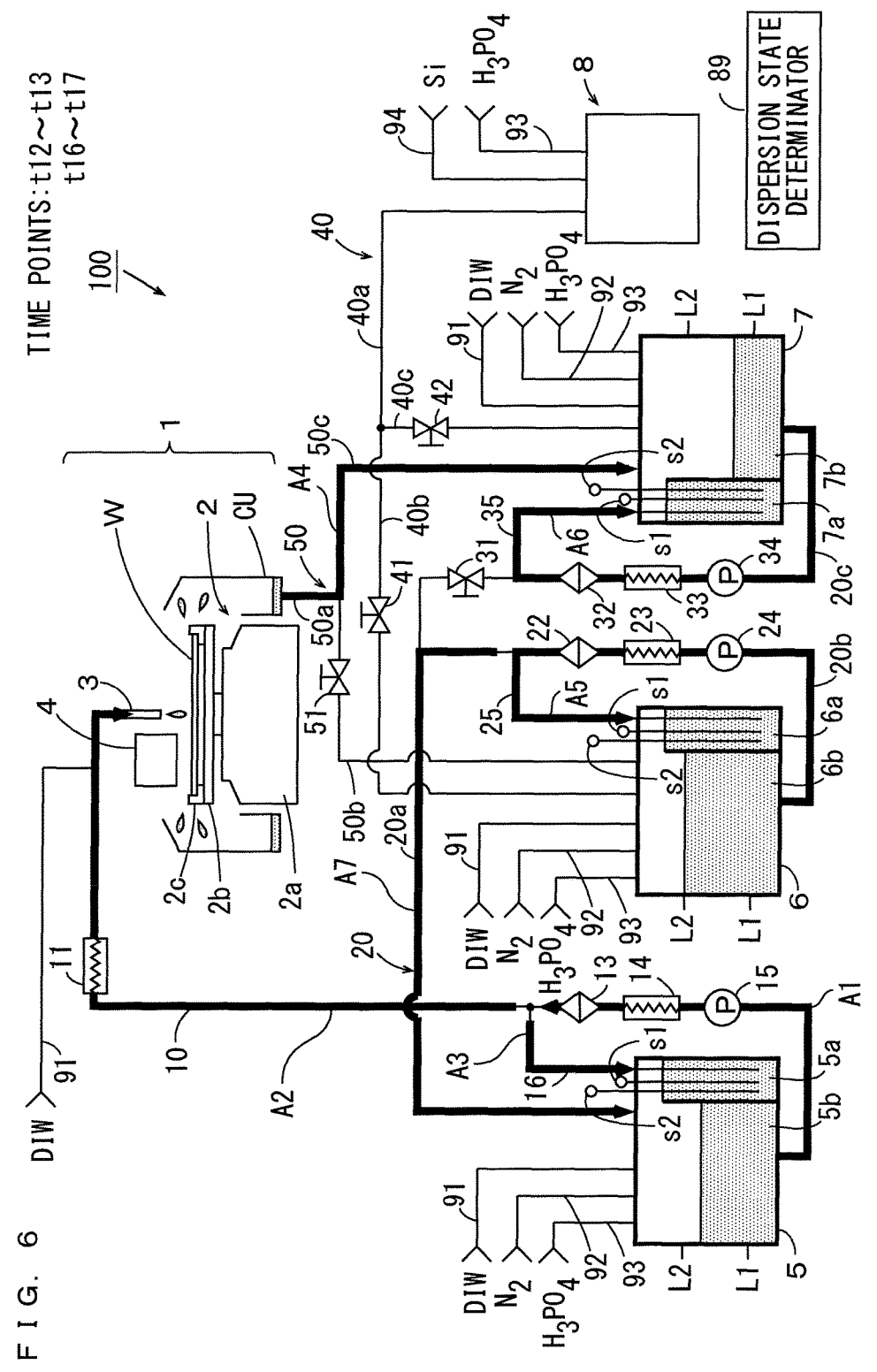

Thus, as indicated by a thick arrow A7 in FIG. 6, part of the phosphoric acid aqueous solution that has passed through the branch pipe 20b and the filter 22 from the storage tank 6b of the second tank 6 is sent to the storage tank 5b of the first tank 5 through the main pipe 20a. In this manner, the phosphoric acid aqueous solution having the reference phosphoric acid concentration and the reference silicon concentration is supplied from the second tank 6 to the first tank 5. Thus, the height of the liquid surface in the storage tank 5b is lifted towards the second reference height L2, and the height of the liquid surface in the storage tank 6b is lowered from the second reference height L2.

At a time point t13, it is detected by the liquid surface sensor s3 that the height of the liquid surface in the storage tank 5b of the first tank 5 is equal to the second reference height L2. In this case, the controller 9 stops the supply of the phosphoric acid aqueous solution from the second tank 6 to the first tank 5 by closing the valve 21 of FIG. 1.

At the time point t13, the controller 9 further closes the valve 52 of FIG. 1, and opens the valve 51. Thus, as indicated by a thick arrow A8 in FIG. 7, the used phosphoric acid aqueous solution collected by the cup CU of the processor 1 is sent to the storage tank 6b of the second tank 6. The phosphoric acid concentration adjustment is performed concurrently with the liquid collection in the second tank 6. On the one hand, as shown in FIG. 4, the liquid collection is stopped, and the phosphoric acid concentration adjustment is continued, in the third tank 7.

In the single-substrate processing apparatus, part of the processing liquid is discarded by the rinse process and the like. Therefore, all of the processing liquid used for the process for the substrate W cannot be collected. Therefore, even when the height of the liquid surface in the storage tank 6b is lowered from the second reference height L2 to the first reference height L1 with the height of the liquid surface in the storage tank 5b being kept at the second reference height L2, the height of the liquid surface in the storage tank 7b is not lifted from the first reference height L1 to the second reference height L2.

Therefore, the controller 9 controls the valve 42 and the new liquid supply device 8 of FIG. 1 based on the detection value of the liquid surface sensor s3 of the third tank 7 (FIG. 1) and the measurement value of the silicon concentration meter s2 such that the height of the liquid surface in the storage tank 7b is lifted to the second reference height L2. Further, the controller 9 controls the valve 42 and the new liquid supply device 8 of FIG. 1 based on the detection value of the liquid surface sensor s3 of the third tank 7 (FIG. 1) and the measurement value of the silicon concentration meter s2 such that the silicon concentration of the phosphoric acid aqueous solution in the storage tank 7b becomes close to the reference silicon concentration.

For example, when the measurement value of the silicon concentration meter s2 of the third tank 7 is equal to the reference silicon concentration, the controller 9 sets the target silicon concentration to the reference silicon concentration. Further, the controller 9 opens the valve 42 of FIG. 1 after controlling the new liquid supply device 8 such that the phosphoric acid aqueous solution having the target silicon concentration is produced. Thus, as indicated by a thick arrow A9 in FIG. 7, the phosphoric acid aqueous solution having the target silicon concentration is supplied from the new liquid supply device 8 to the third tank 7. As a result, the height of the liquid surface in the storage tank 7b is lifted to the second reference height L2, and the silicon concentration in the storage tank 7b is kept at the reference silicon concentration.

On the one hand, when the measurement value from the silicon concentration meter s2 of the third tank 7 is lower than the reference silicon concentration, the controller 9 sets the target silicon concentration higher than the reference silicon concentration. Further, the controller 9 opens the valve 42 of FIG. 1 after controlling the new liquid supply device 8 such that the phosphoric acid aqueous solution having the target silicon concentration is produced. Thus, the phosphoric acid aqueous solution having the higher silicon concentration than the reference silicon concentration is supplied from the new liquid supply device 8 to the third tank 7. As a result, the height of the liquid surface in the storage tank 7b is lifted to the second reference height L2, and the silicon concentration in the storage tank 7b is increased to be adjusted to the reference silicon concentration.

On the other hand, when the measurement value from the silicon concentration meter s2 of the third tank 7 is higher than the reference silicon concentration, the controller 9 sets the target silicon concentration lower than the reference silicon concentration. Further, the controller 9 opens the valve 42 of FIG. 1 after controlling the new liquid supply device 8 such that the phosphoric acid aqueous solution having the target silicon concentration is produced. Thus, the phosphoric acid aqueous solution having the silicon concentration lower than the reference silicon concentration is supplied from the new liquid supply device 8 to the third tank 7. As a result, the height of the liquid surface in the storage tank 7b is lifted to the second reference height L2, and the silicon concentration in the storage tank 7b is reduced to be adjusted to the reference silicon concentration.

As described above, an operation of lifting the height of the liquid surface in the storage tank 7b to the second reference height L2 and adjusting the silicon concentration of the phosphoric acid aqueous solution to the reference silicon concentration is referred to as a silicon concentration adjustment.

In the present embodiment, when the silicon concentration adjustment is performed, the phosphoric acid concentration adjustment is performed concurrently with the silicon concentration adjustment. Thus, even when the phosphoric acid aqueous solution supplied from the new liquid supply device 8 to the third tank 7 does not have the reference phosphoric acid concentration, the phosphoric acid concentration in the storage tank 7b is adjusted to the reference phosphoric acid concentration.

At a time point t14, it is detected from the measurement values of the phosphoric acid concentration meter s1 and the silicon concentration meter s2 that the phosphoric acid aqueous solution having the reference phosphoric acid concentration and the reference silicon concentration is stored in the storage tank 7b of the third tank 7. In this case, the controller 9 stops the supply of the phosphoric acid aqueous solution from the new liquid supply device 8 to the third tank 7 by closing the valve 42 of FIG. 1, and finishes the silicon concentration adjustment in the third tank 7. Simultaneously, the controller 9 finishes the phosphoric acid concentration adjustment in the third tank 7.

In the present embodiment, a necessary time period from the time when the silicon concentration adjustment is started in the second tank 6 and the third tank 7 until the time when the silicon concentration adjustment is completed in the second tank 6 and the third tank 7 is sufficiently shorter than a necessary time period for the height of the liquid surface in the storage tank 5b to be lowered from the second reference height L2 to the first reference height L1 by the process for the substrate W.

At the time point t14, the controller 9 further opens the valve 31 of FIG. 1. Thus, as indicated by a thick arrow A10 in FIG. 8, part of the phosphoric acid aqueous solution that has passed through the branch pipe 20c and the filter 32 from the storage tank 7b of the third tank 7 is sent to the storage tank 5b of the first tank 5 through the main pipe 20a. In this manner, the phosphoric acid aqueous solution having the reference phosphoric acid concentration and the reference silicon concentration is supplied from the third tank 7 to the first tank 5. Thus, the height of the liquid surface in the storage tank 5b is lifted towards the second reference height L2, and the height of the liquid surface in the storage tank 7b is lowered from the second reference height L2.

At a time point t15, it is detected by the liquid surface sensor s3 that the height of the liquid surface in the first tank 5 is equal to the second reference height L2. In this case, the controller 9 stops the supply of the phosphoric acid aqueous solution from the third tank 7 to the first tank 5 by closing the valve 31 of FIG. 1.

At the time point t15, the controller 9 controls the valve 41 and the new liquid supply device 8 of FIG. 1 based on the detection value of the liquid surface sensor s3 of the second tank 6 (FIG. 1) and the measurement value of the silicon concentration meter s2 such that the height of the liquid surface in the storage tank 6b is lifted to the second reference height L2, and the controller 9 controls the valve 41 and the new liquid supply device 8 of FIG. 1 based on the detection value of the liquid surface sensor s3 of the second tank 6 (FIG. 1) and the measurement value of the silicon concentration meter such that the silicon concentration of the phosphoric acid aqueous solution in the storage tank 6b becomes close to the reference silicon concentration.

Specifically, the controller 9 opens the valve 41 of FIG. 1 after calculating the target silicon concentration of the phosphoric acid aqueous solution to be produced by the new liquid supply device 8 and controlling the new liquid supply device 8 such that the phosphoric acid aqueous solution having the calculated target silicon concentration is produced.

Thus, as indicated by a thick arrow A11 in FIG. 9, the phosphoric acid aqueous solution having the target silicon concentration is supplied from the new liquid supply device 8 to the second tank 6. In this manner, the silicon concentration of the phosphoric acid aqueous solution in the storage tank 6b is adjusted to the reference silicon concentration. Further, the phosphoric acid concentration adjustment is performed concurrently with this silicon concentration adjustment.

At the time point t15, the controller 9 further closes the valve 51 of FIG. 1, and opens the valve 52 of FIG. 1. Thus, as indicated by a thick arrow A4 in FIG. 9, the used phosphoric acid aqueous solution collected by the cup CU of the processor 1 is sent to the storage tank 7b of the third tank 7 through the main pipe 50a and the branch pipe 50c. Simultaneously, the controller 9 starts the phosphoric acid concentration adjustment in the third tank 7.

At a time point t16, it is detected that the phosphoric acid aqueous solution having the reference phosphoric acid concentration and the reference silicon concentration is stored in the storage tank 6b of the second tank 6 by the measurement values of the phosphoric acid concentration meter s1 and the silicon concentration meter s2. In this case, the controller 9 stops the supply of the phosphoric acid aqueous solution from the new liquid supply device 8 to the second tank 6 by closing the valve 41 of FIG. 1, and finishes the silicon concentration adjustment in the second tank 6. Simultaneously, the controller 9 finishes the phosphoric acid concentration adjustment in the second tank 6.

At the time point t16, the controller 9 further opens the valve 21 of FIG. 1. In this case, as described above, the phosphoric acid aqueous solution having the reference phosphoric acid concentration and the reference silicon concentration is supplied from the second tank 6 to the first tank 5. Thus, the height of the liquid surface in the storage tank 5b is lifted towards the second reference height L2, and the height of the liquid surface in the storage tank 6b is lowered from the second reference height L2.

At a time point t17, it is detected by the liquid surface sensor s3 that the height of the liquid surface in the storage tank 5b of the first tank 5 is equal to the second reference height L2. In this case, the controller 9 stops the supply of the phosphoric acid aqueous solution from the second tank 6 to the first tank 5 by closing the valve 21 of FIG. 1.

After the time point t17, the operations from the time point t13 to the time point t15 and the operations from the time point t15 to the time point t17 are repeated until the process for the substrate W is stopped. Thus, in the first tank 5, the phosphoric acid aqueous solution having the reference phosphoric acid concentration and the reference silicon concentration is held at all times.

(5) Effects of First Embodiment

In the new liquid supply device 8 according to the present embodiment, with the phosphoric acid aqueous solution being stored in the production tank 80 and the phosphoric acid aqueous solution flowing in the bypass pipe 86a without being sent to the filter 82, the silicon containing liquid for adjusting the silicon concentration in the phosphoric acid aqueous solution to the target silicon concentration is supplied to the production tank 80.

Thus, after the silicon containing liquid is supplied, aggregates of the locally concentrated silicon particles are not caught by filter 82. Therefore, clogging of the filter 82 due to the silicon particles is prevented. Further, the phosphoric acid aqueous solution is circulated through the coupling pipe 40x, the bypass pipe 86a and the circulation pipe 87a, so that the phosphoric acid aqueous solution is stirred. Thus, the silicon particles in the phosphoric acid aqueous solution are uniformly dispersed in a short period of time.

Thereafter, when it is determined that the silicon particles of the silicon containing liquid are uniformly dispersed in the phosphoric acid aqueous solution, the valve 83 of FIG. 2 is open, so that the phosphoric acid aqueous solution flows through the filter 82. In this case, impurities in the phosphoric acid aqueous solution are removed by the filter 82. On the one hand, the silicon particles dispersed in the phosphoric acid aqueous solution are not caught by the filter 82. Thus, all of the silicon particles supplied to the phosphoric acid aqueous solution can be dissolved in the phosphoric acid aqueous solution.

Thereafter, the phosphoric acid aqueous solution stored in the production tank 80 is supplied to the second tank 6 or the third tank 7 through the filter 82. In the second tank 6 or the third tank 7, the silicon concentration of the phosphoric acid aqueous solution can be accurately adjusted to the reference silicon concentration by the phosphoric acid aqueous solution having the target silicon concentration.

As a result, the processing liquid having the uniform silicon concentration can be stably produced in a short period of time. As a result, the process of selectively etching the silicon nitride film of the silicon oxide film and the silicon nitride film on the substrate W can be accurately and easily performed in a short period of time.

In the above-mentioned new liquid supply device 8, the production tank 80 has the cylindrical sidewall. In this case, a corner portion is not present at an inner surface of the sidewall of the production tank 80, so that a region in which the silicon particles stay is unlikely to occur inside of the production tank 80. Therefore, the silicon particles can be efficiently dissolved by the phosphoric acid aqueous solution.

In the production tank 80, a bubbling function for preventing the phosphoric acid aqueous solution from staying in the production tank 80 may be provided. Further, in the production tank 80, a stirring device for stirring the phosphoric acid aqueous solution in the production tank 80 may be provided. In these cases, when the silicon containing liquid is supplied to the production tank 80, the silicon particles in the phosphoric acid aqueous solution can be more uniformly dispersed in a shorter period of time.

[2] Second Embodiment

In the first embodiment, the phosphoric acid aqueous solution having the target silicon concentration is produced by the new liquid supply device 8, and the produced phosphoric acid aqueous solution is supplied to the second tank 6 or the third tank 7. The silicon concentration of the phosphoric acid aqueous solution is adjusted to the reference silicon concentration in the second tank 6 or the third tank 7. The adjusted phosphoric acid aqueous solution is supplied to the first tank 5.

Figure 10:
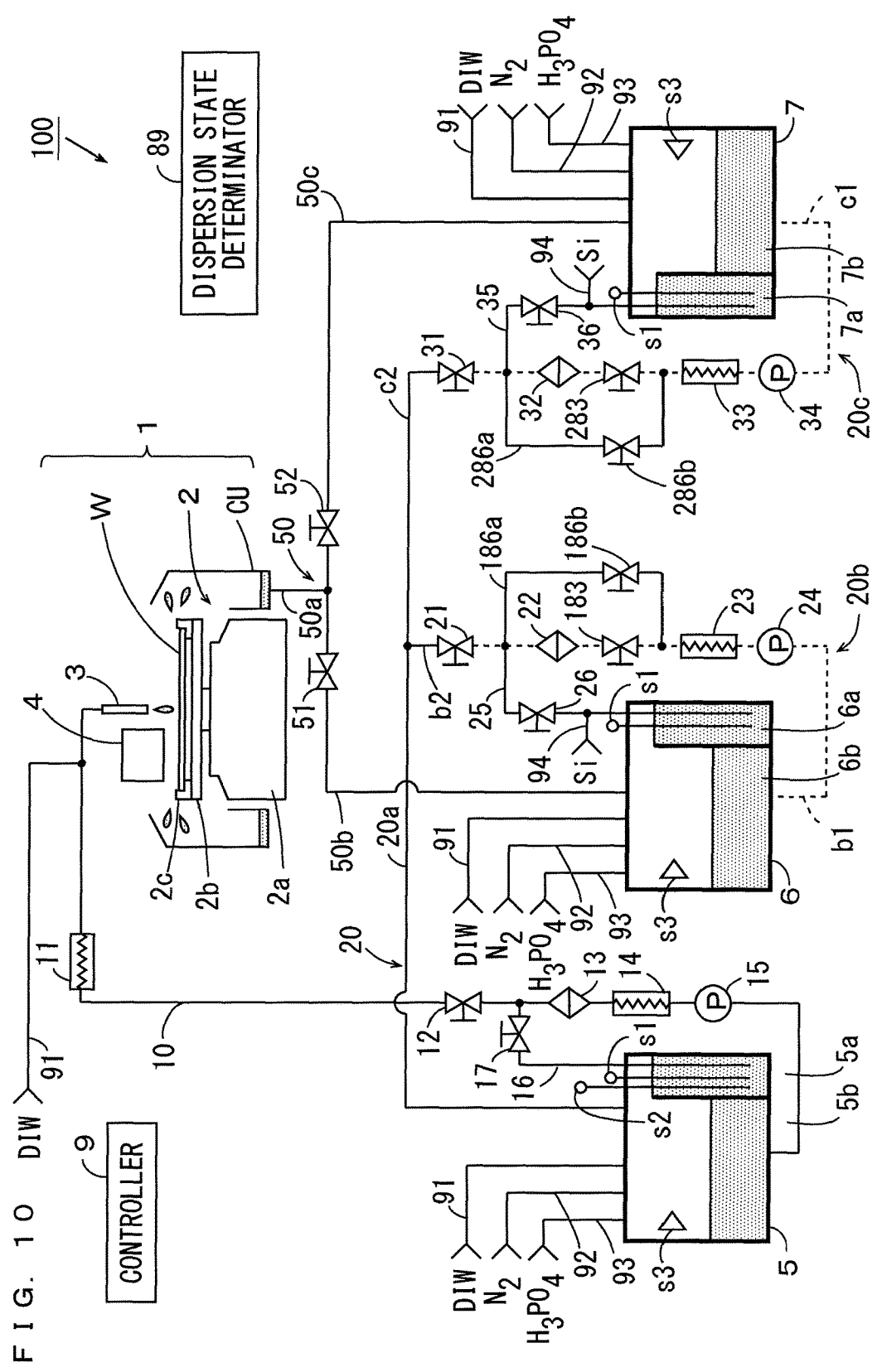

The invention is not limited to the above-mentioned example. The substrate processing apparatus 100 may have a configuration and operations described below. FIG. 10 is a schematic diagram showing the configuration of the substrate processing apparatus 100 according to the second embodiment. The substrate processing apparatus 100 of FIG. 10 according to the second embodiment is different from the substrate processing apparatus 100 of FIG. 1 according to the first embodiment in the following points.

In the following description, a portion, of the branch pipe 20b, that connects the valve 21 to the second tank 6 is referred to as an upstream branch pipe portion b1, and a portion, of the brank pipe 20b, that connects the valve 21 to the main pipe 20a is referred to as a downstream branch pipe portion b2. Further, a portion, of the branch pipe 20c, that connects the valve 31 to the third tank 7 is referred to as an upstream branch pipe portion c1, and a portion, of the branch pipe 20c, that connects the valve 31 to the main pipe 20a is referred to as a downstream branch pipe portion c2. In FIG. 10, the upstream branch pipe portions b1, c1 are indicated by dotted lines.

The new liquid supply device 8 of FIG. 1 is not provided in the substrate processing apparatus 100 of FIG. 10. A valve 183 is provided at a portion, of the upstream branch pipe portion b1, that is located between the heater 23 and the filter 22. Further, a bypass pipe 186a is provided to connect a portion, of the upstream branch pipe portion b1, that is located between the heater 23 and the valve 183 to a portion, of the upstream branch pipe portion b1, that is located between the filter 22 and the valve 21 is provided. A valve 186b is inserted into the bypass pipe 186a.

Further, a valve 283 is provided at a portion, of the upstream branch pipe portion c1, that is located between the heater 33 and the filter 32. Further, a bypass pipe 286a is provided to connect a portion, of the upstream branch pipe portion c1, that is located between the heater 33 and the valve 283 to a portion, of the upstream branch pipe portion c1, that is located between the filter 32 and the valve 31. A valve 286b is inserted into the bypass pipe 286a.

Further, a silicon containing liquid supply system 94 is connected to a portion, of the circulation pipe 25, that is located between the valve 26 and the second tank 6 and a portion, of the circulation pipe 35, that is located between the valve 36 and the third tank 7.

Further, while the silicon concentration meter s2 of FIG. 1 is provided in each of the circulation tanks 6a, 7a, the dispersion state determinator 89 is connected to each of the second tank 6 and the third tank 7. Thus, the silicon concentration meter 89a of FIG. 2 measures the silicon concentration in each of the circulation tanks 6a, 7a.

In the substrate processing apparatus 100 of FIG. 10, the process for the substrate W is performed according to the time chart of FIG. 4. However, during the silicon concentration adjustment in the third tank 7, the substrate processing apparatus 100 of FIG. 10 is operated as described below. During a period in which the silicon concentration adjustment is not performed, the valves 183, 283 are kept open. Further, the valves 186b, 286b are kept closed.

At the time point t13 of FIG. 4, the controller 9 controls the valves 283, 286b and the silicon containing liquid supply system 94 based on the measurement values of the liquid surface sensor s3 of the third tank 7 and the silicon concentration meter 89a of FIG. 2. Specifically, the controller 9 calculates necessary amounts of the phosphoric acid aqueous solution and the silicon containing liquid in order to store the phosphoric acid aqueous solution having the reference silicon concentration to the second reference height L2 based on the measurement values of the liquid surface sensor s3 of the third tank 7 and the silicon concentration meter 89a of FIG. 2.

Subsequently, the controller 9 controls the phosphoric acid aqueous solution supply system 93 such that the liquid surface of the phosphoric acid aqueous solution reaches the second reference height L2. When the liquid surface of the phosphoric acid aqueous solution reaches the second reference height L2, the controller 9 closes the valve 283 and opens the valve 286b. Thus, the filter 22 is bypassed by the bypass pipe 286a. Simultaneously, the controller 9 supplies the calculated amount of the silicon containing liquid to the third tank 7 by controlling the silicon containing liquid supply system 94.

Thereafter, it is determined by the dispersion state determinator 89 that the silicon particles are uniformly dispersed, so that the controller 9 opens the valve 283, and closes the valve 286b. Thus, the phosphoric acid aqueous solution flows in the storage tank 7b, the upstream branch pipe portion c1 and the circulation pipe 35. In this manner, the height of the liquid surface in the storage tank 7b is lifted to the second reference height L2, and the silicon concentration in the phosphoric acid aqueous solution in the storage tank 7b is adjusted to the reference silicon concentration.

Also during the silicon concentration adjustment in the second tank 6, similar operations to the operations during the silicon concentration adjustment in the third tank 7 are performed.

Also in the present embodiment, after the silicon containing liquid is supplied, the phosphoric acid aqueous solution is not sent to the filters 22, 32 unless it is determined that the silicon particles are uniformly dispersed. Thus, aggregates of the locally concentrated silicon particles are not caught by the filters 22, 32 after the silicon containing liquid is supplied. Therefore, clogging of the filters 22, 32 due to the silicon particles is prevented. Further, because the silicon particles are not caught by the filters 22, 32, all of the silicon particles supplied to the phosphoric acid aqueous solution can be dissolved in the phosphoric acid aqueous solution. Thus, the silicon concentration of the phosphoric acid aqueous solution can be uniformly and accurately adjusted to the reference silicon concentration.

As described above, in the present embodiment, the second tank 6 and its peripheral members, and the third tank 7 and its peripheral members are operated similarly to the new liquid supply device 8 of FIG. 2. Thus, the production tank 80 of the new liquid supply device 8 is unnecessary. Therefore, a reduction in size of the substrate processing apparatus 100 is realized.

[3] Third Embodiment (1) Configuration of Substrate Processing Apparatus

Figure 11:
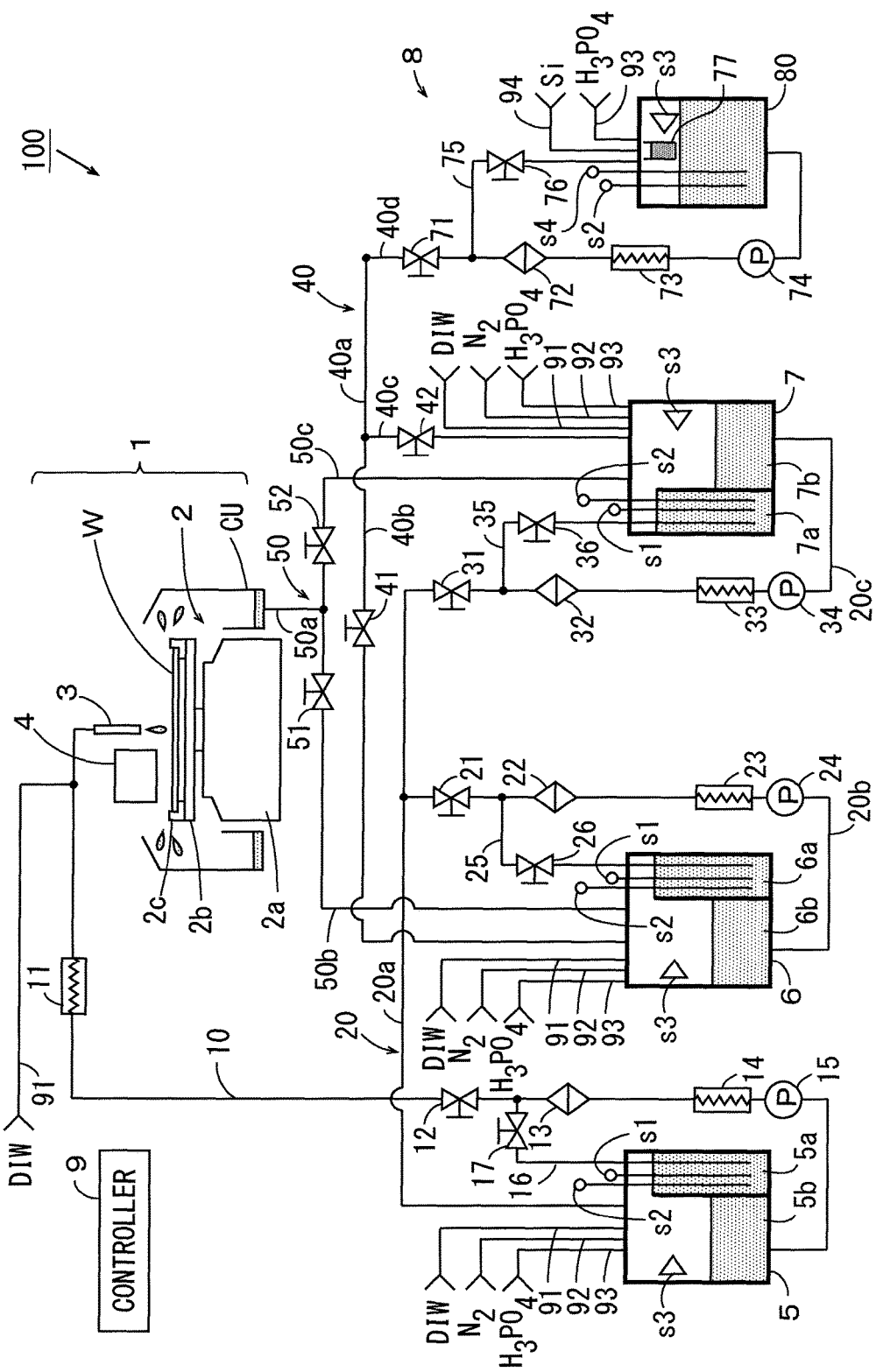
FIG. 11 is a schematic diagram showing a configuration of a substrate processing apparatus according to a third embodiment.

FIG. 11 is a schematic diagram showing the configuration of the substrate processing apparatus according to the third embodiment. As shown in FIG. 11, the substrate processing apparatus 100 mainly includes a processor 1, a first tank 5, a second tank 6, a third tank 7, a new liquid supply device 8 and a controller 9. Further, the processor 1 includes a spin chuck 2, a processing liquid nozzle 3, a heating device 4 and a cup CU. In the processor 1, a plurality of substrates W are sequentially processed one by one. The substrate processing apparatus 100 according to the present embodiment has the same configuration as the substrate processing apparatus 100 of FIG. 1 according to the first embodiment except for the following points.

The dispersion state determinator 89 of FIG. 1 is not provided in the substrate processing apparatus 100 according to the present embodiment. Further, in the substrate processing apparatus 100 according to the present embodiment, the configurations of the new liquid supply device 8 and its peripheral members are different from the configurations of the new liquid supply device 8 and its peripheral members of FIGS. 1 and 2.

The new liquid supply device 8 includes a production tank 80. The new liquid supply device 8 supplies the processing liquid produced in the production tank 80 to the second tank 6 and the third tank 7. Details of the new liquid supply device 8 according to the present embodiment will be described below.

The third supply pipe 40 is provided to connect the new liquid supply device 8 to each of the storage tanks 6b, 7b of each of the second and third tanks 6, 7. The third supply pipe 40 has one main pipe 40a and three branch pipes 40b, 40c, 40d. One end of each of the branch pipes 40b, 40c is connected to one end of the main pipe 40a. One end of the branch pipe 40d is connected to the other end of the main pipe 40a. The other end of each of the two branch pipes 40b, 40c is connected to each of the storage tanks 6b, 7b of each of the second and third tanks 6, 7. The valve 41 is inserted into the branch pipe 40b, and the valve 42 is inserted into the branch pipe 40c. Further, the other end of the branch pipe 40d is connected to the production tank 80 of the new liquid supply device 8.

The controller 9 is constituted by an CPU (Central Processing Unit) and a memory, or a microcomputer and the like. A system program is stored in the memory of the controller 9. The controller 9 controls the operation of each constituent element of the substrate processing apparatus 100.

For example, the controller 9 switches each valve 12, 17, 21, 26, 31, 36, 41, 42, 51, 52 between an open state and a close state based on the detection value of each liquid surface sensor s3. Further, the controller 9 controls a DIW supply system 91, a nitrogen gas supply system 92 and a phosphoric acid aqueous solution supply system 93 based on a measurement value of each phosphoric acid concentration meter s1. Further, the controller 9 controls the new liquid supply device 8 based on a measurement value of each silicon concentration meter s2.

(2) Configuration and Operation of New Liquid Supply Device

Figure 12:
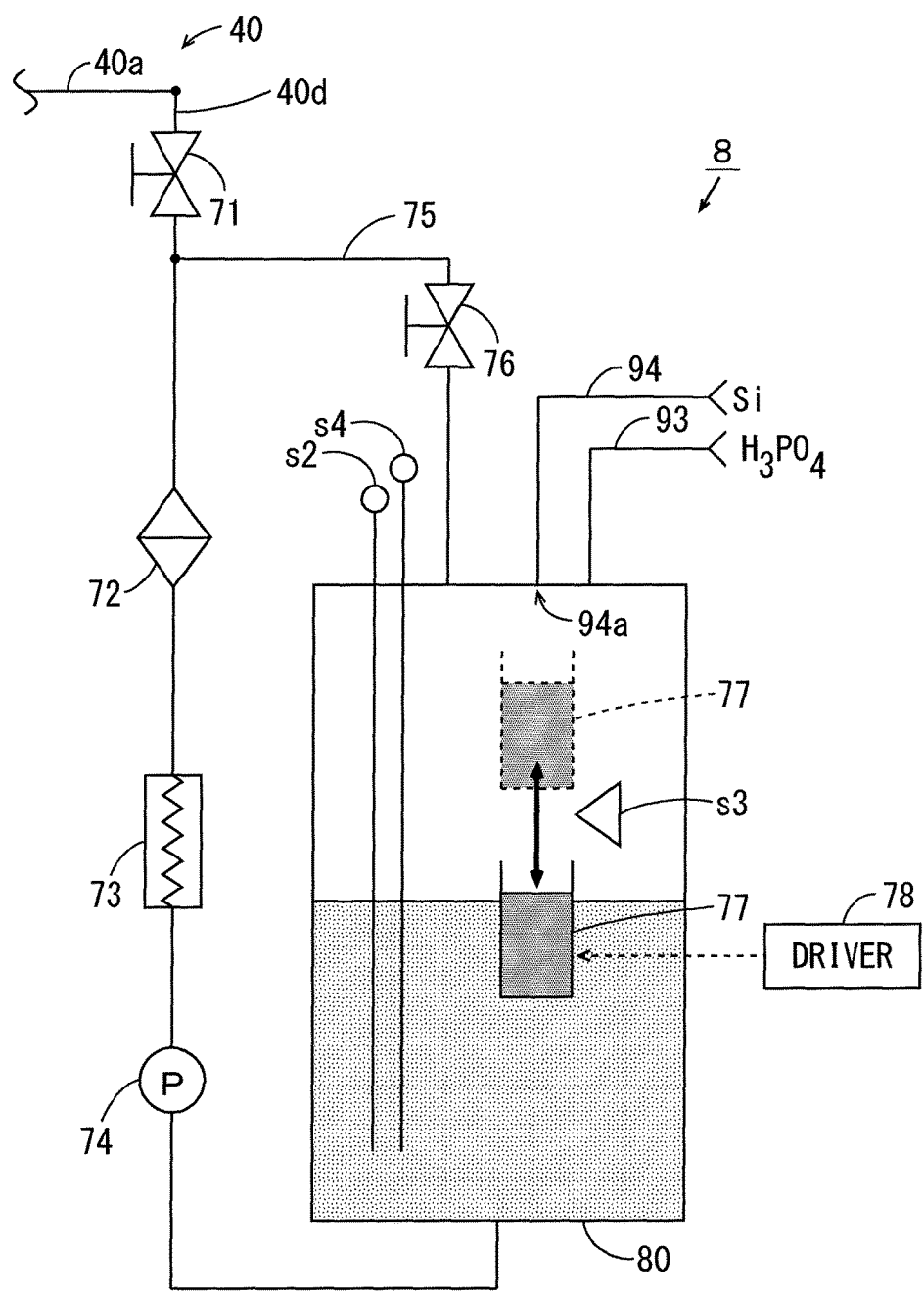
FIG. 12 is a schematic diagram showing a configuration of a new liquid supply device of FIG. 11.

FIG. 12 is a schematic diagram showing the configuration of the new liquid supply device 8 of FIG. 11. As shown in FIG. 12, the new liquid supply device 8 includes the production tank 80. In the present example, the production tank 80 has a cylindrical sidewall. The invention is not limited to this, and the production tank 80 may have a prismatic sidewall.

The branch pipe 40d of the third supply pipe 40 is connected to the production tank 80. A pump 74, a heater 73, a filter 72 and a valve 71 are inserted into the branch pipe 40d in this order from the production tank 80 towards the main pipe 40a. A circulation pipe 75 is provided to connect a portion, of the branch pipe 40d, that is located between the filter 72 and the valve 71 to the production tank 80. A valve 76 is inserted into the circulation pipe 75.

A phosphoric acid aqueous solution supply system 93 and a silicon containing liquid supply system 94 are connected to the production tank 80. A silicon containing liquid is made of silicon particles, an organic solvent and pure water. The silicon particles having a particle diameter of about 15 nm can be used as the silicon particles. Methanol can be used as the organic solvent. The organic solvent has a function of preventing the silicon particles from being aggregated when the silicon containing liquid is supplied to a phosphoric acid aqueous solution. Further, in the production tank 80, the silicon concentration meter s2, the liquid surface sensor s3 and the temperature sensor s4 are provided. The temperature sensor s4 measures the temperature of the phosphoric acid aqueous solution.

The phosphoric acid aqueous solution is supplied from the phosphoric acid aqueous solution supply system 93 to the production tank 80 based on the detection value of the liquid surface sensor s3, so that the phosphoric acid aqueous solution is stored to a predetermined height in the production tank 80. The silicon containing liquid supplied from the silicon containing liquid supply system 94 is mixed with the phosphoric acid aqueous solution stored in the production tank 80, so that the processing liquid is produced.

A boiling point of the organic solvent included in the silicon containing liquid is lower than the temperature of the phosphoric acid aqueous solution during the production of the processing liquid, so that the organic solvent evaporates in a short period of time. Therefore, even when the particle diameter of the silicon particles included in the silicon containing liquid is small, the silicon particles are likely to be aggregated, so that aggregates of silicon are likely to occur. When such aggregates of silicon occur, clogging of the filter 72 occurs and the silicon concentration of the processing liquid becomes non-uniform.

A filtration member 77 formed of a porous material, for example, is provided in the production tank 80. The filtration member 77 has a cylindrical shape made of a bottom portion and a sidewall portion. An upper portion of the filtration member 77 is open. In the present example, the filtration member 77 is formed of a filtration film made of polytetrafluoroethylene (PTFE). A bore diameter of the filtration member 77 is not more than a bore diameter of the filter 72. The bore diameter of the filtration member 77 is 10 nm, for example, and the bore diameter of the filter 72 is 20 nm, for example. The bore diameter of the filtration member 77 is preferably not more than 10 nm.

The new liquid supply device 8 further includes a driver 78 that moves the filtration member 77 between a preparation position and a dipping position in the production tank 80. The preparation position is a position below a supply port 94a of the silicon containing liquid supply system 94 and above the liquid surface of the liquid stored in the production tank 80. The dipping position is a position below the preparation position and in the liquid stored in the production tank 80. When the filtration member 77 is at the dipping position, part of the filtration member 77 is dipped in the liquid in the production tank 80. In the example of FIG. 12, the filtration member 77 being located at the preparation position is indicated by a dotted line, and the filtration member 77 being located at the dipping position is indicated by a solid line.

The silicon containing liquid supply system 94 supplies the silicon containing liquid to the inside of the filtration member 77 from above with the filtration member 77 being at the preparation position. The filtration member 77 is moved to the dipping position, so that the silicon containing liquid filtered by the filtration member 77 and the stored phosphoric acid aqueous solution are mixed at a predetermined ratio in the production tank 80. Thus, a new processing liquid is produced. The produced processing liquid is kept at a predetermined temperature.

When the silicon containing liquid in the filtration member 77 includes a sufficient amount of the silicon particles, only an amount of the silicon particles that can be dissolved in the phosphoric acid aqueous solution stored in the production tank 80 are mixed with the phosphoric acid aqueous solution through the filtration member 77. The other silicon particles are not dissolved in the phosphoric acid aqueous solution and remain in the filtration member 77. Therefore, it is possible to easily produce a processing liquid having silicon saturated concentration without mixing an excessive amount of the silicon particles in the phosphoric acid aqueous solution. In this case, the temperature of the processing liquid is kept constant, so that the silicon concentration of the processing liquid is kept constant.

This configuration causes the silicon containing liquid to be filtered by the filtration member 77 in the phosphoric acid aqueous solution. Thus, an occurrence of the aggregates of silicon is prevented. As a result, clogging of the filter 72 is prevented, and the silicon concentration of the processing liquid can be made uniform. Further, the aggregated silicon particles are prevented from contaminating the substrate as particles.

In the new liquid supply device 8, the silicon concentration in the production tank 80 can be adjusted to a value lower than the silicon saturated concentration. For example, an amount of the silicon particles included in the silicon containing liquid stored in the filtration member 77 is limited to a constant amount, so that the silicon concentration of the processing liquid can be made lower than the silicon saturated concentration. Alternatively, the phosphoric acid aqueous solution is added from the phosphoric acid aqueous solution supply system 93 to the production tank 80, so that the silicon concentration of the processing liquid can be made lower than the silicon saturated concentration.

The new liquid supply device 8 may be configured to perform a feedback control on an amount of the silicon particles stored in the filtration member 77 or the phosphoric acid aqueous solution added to the production tank 80 based on the measurement value of the silicon concentration meter s2. Thus, the processing liquid having any silicon concentration can be produced. In the following description, the silicon concentration of the processing liquid to be targeted in the new liquid supply device 8 is referred to as target silicon concentration.

Figure 13:
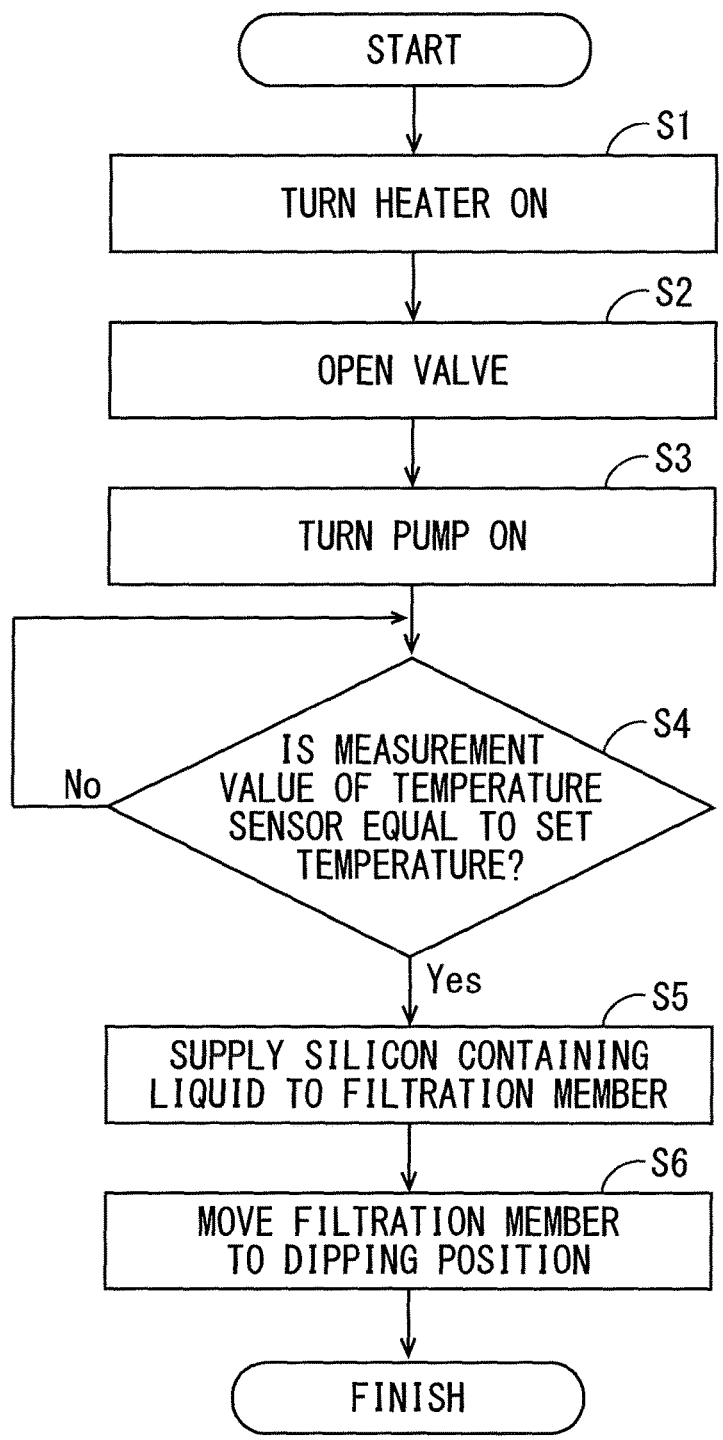
FIG. 13 is a flow chart showing a processing liquid production process by the new liquid supply device.

FIG. 13 is a flow chart showing a processing liquid production process by the new liquid supply device 8. The processing liquid production process by the new liquid supply device 8 will be described below according to the flow chart of FIG. 13. In the example of FIG. 13, the processing liquid having the silicon saturated concentration is produced.

In the initial state, the valves 71, 76 are closed, the heater 73 and the pump 74 are turned off, and the filtration member 77 is arranged at the preparation position. Further, in the initial state, the phosphoric acid aqueous solution is supplied from the phosphoric acid aqueous solution supply system 93, so that the phosphoric acid aqueous solution is stored to the predetermined height in the production tank 80. In this state, the controller 9 of FIG. 11 turns the heater 73 on (step S1), opens the valve 76 (step S2), and turns the pump 74 on (step S3).

In this case, the phosphoric acid aqueous solution in the production tank 80 is sucked by the pump 74, and is sent to the filter 72 through the heater 73. The heater 73 heats the phosphoric acid aqueous solution flowing in the branch pipe 40d, thereby increasing the temperature of the phosphoric acid aqueous solution to a preset temperature (hereinafter referred to as a set temperature). In the present example, the set temperature is 150° C., for example. The filter 72 removes unnecessary deposits and the like by filtering the phosphoric acid aqueous solution. The phosphoric acid aqueous solution that has passed through the filter 72 is returned to the production tank 80 through the circulation pipe 75. Thus, the temperature and cleanliness of the phosphoric acid aqueous solution in the production tank 80 are kept substantially constant.

Subsequently, the controller 9 determines whether the measurement value of the temperature sensor s4 is equal to the set temperature (step S4). In step S4, when the measurement value of the temperature sensor s4 is not equal to the set temperature, the controller 9 waits until the measurement value of the temperature sensor s4 is equal to the set temperature. On the one hand, in step S4, when the measurement value of the temperature sensor s4 is equal to the set temperature, the controller 9 supplies the silicon containing liquid to the inside of the filtration member 77 by controlling the silicon containing liquid supply system 94 (step S5). Thus, the silicon containing liquid is stored in the filtration member 77. The silicon containing liquid stored in the filtration member 77 includes a sufficient amount of the silicon particles.

Thereafter, the controller 9 moves the filtration member 77 to the dipping position as indicated by a solid line in FIG. 12 by controlling the driver 78 (step S6). In this case, the silicon containing liquid in the filtration member 77 is filtered by the filtration member 77 and is supplied to the production tank 80. Thus, the silicon containing liquid, and the phosphoric acid aqueous solution at the set temperature that is stored in the production tank 80 are mixed in the production tank 80. As a result, the processing liquid having the silicon saturated concentration is produced.

In the above-mentioned processing liquid production process, the processes of step S1 to S3 may be performed in any order. Further, the process of step S5 may be performed at any time point among the processes of step S1 to S6, and may be performed at a time point in the initial state before step S1.

(3) Operation of Substrate Processing Apparatus

Figure 14:
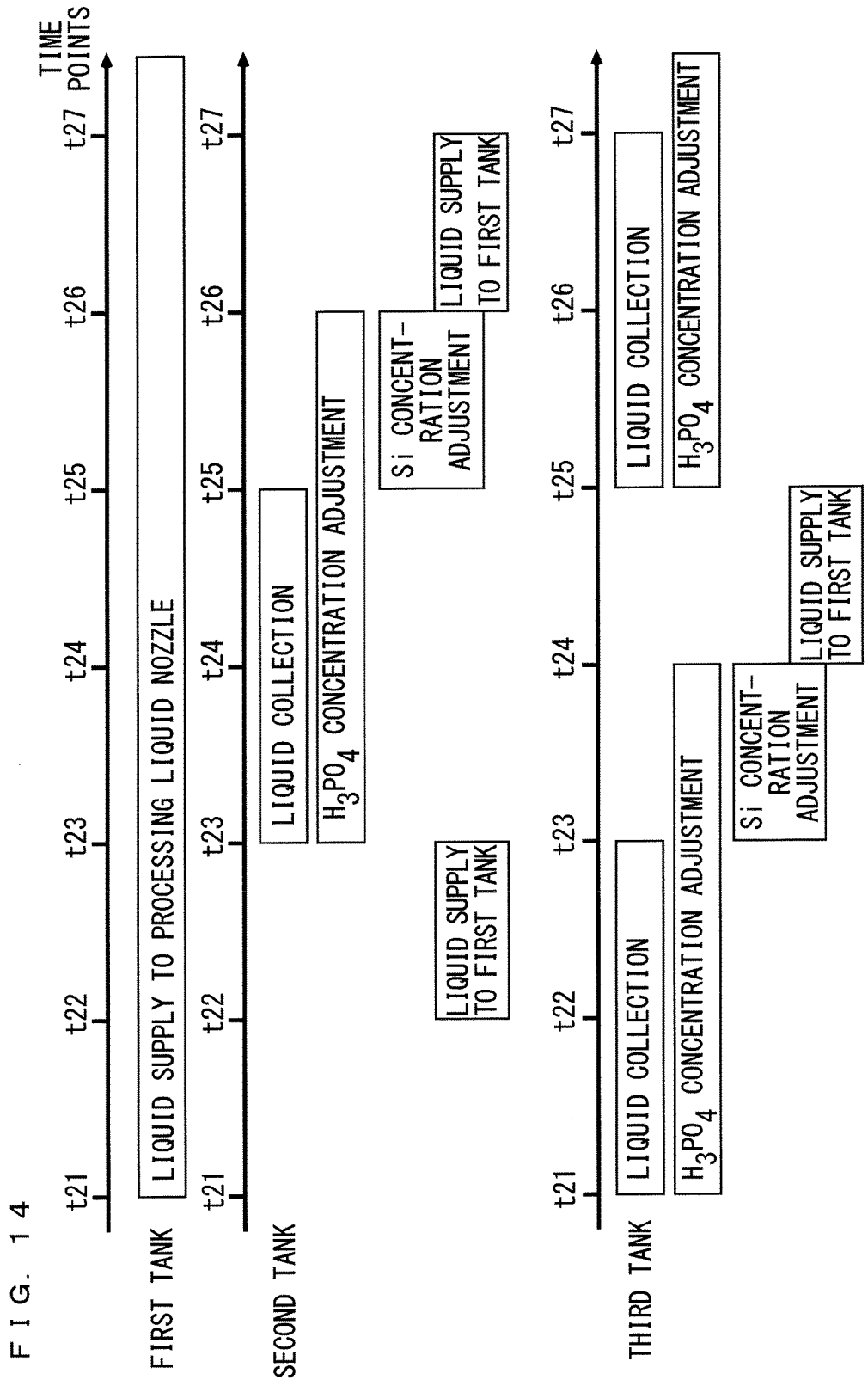
FIG. 14 is a time chart showing contents of operations respectively related to first, second and third tanks of FIG. 11.

A series of operations of the substrate processing apparatus 100 of when the plurality of substrates W are processed by the processor 1 will be described. FIG. 14 is a time chart showing the contents of operations respectively related to the first, second and third tanks 5, 6, 7 of FIG. 11. FIGS. 15 to 19 are schematic diagrams showing the operation of the substrate processing apparatus 100 from a time point t21 to a time point t27 of FIG. 14. In the following description, operations in the new liquid supply device 8 of FIG. 12 will not be described.

In the first, second and third tanks 5, 6, 7 according to the present embodiment, a first reference height L1 and a second reference height L2 are set in the storage tanks 5b, 6b, 7b similarly to the first, second and third tanks 5, 6, 7 according to the first embodiment.

In the initial state, the phosphoric acid aqueous solution having the reference phosphoric acid concentration and the reference silicon concentration is stored in the first and second tanks 5, 6. In the first and second tanks 5, 6, the height of the liquid surface of the phosphoric acid aqueous solution is kept at the second reference height L2.

Further, the phosphoric acid aqueous solution that does not have the reference phosphoric acid concentration and the reference silicon concentration is stored in the third tank 7. In the third tank 7, the height of the liquid surface of the phosphoric acid aqueous solution is kept at the first reference height L1. The valves 12, 17, 21, 26, 31, 36, 41, 42, 51, 52 of FIG. 11 are closed.

When the power of the substrate processing apparatus 100 is turned on from the initial state, the operations of heaters 11, 14, 23, 33, pumps 15, 24, 34 and the new liquid supply device 8 of FIG. 11 are started. In this state, the first substrate W is carried into the spin chuck 2 of the processor 1. Further, the substrate W is held and rotated by the spin chuck 2.

Thereafter, at the time point t21 of FIG. 14, the controller 9 of FIG. 11 opens the valves 12, 17 of FIG. 11. Thus, as indicated by a thick arrow B1 in FIG. 15, the phosphoric acid aqueous solution in the storage tank 5b is sucked by the pump 15, and is sent to the filter 13 through the heater 14. The heater 14 heats the phosphoric acid aqueous solution passing through the first supply pipe 10 to a predetermined temperature (150° C., for example). The filter 13 removes unnecessary deposits and the like by filtering the phosphoric acid aqueous solution.

Figure 15:
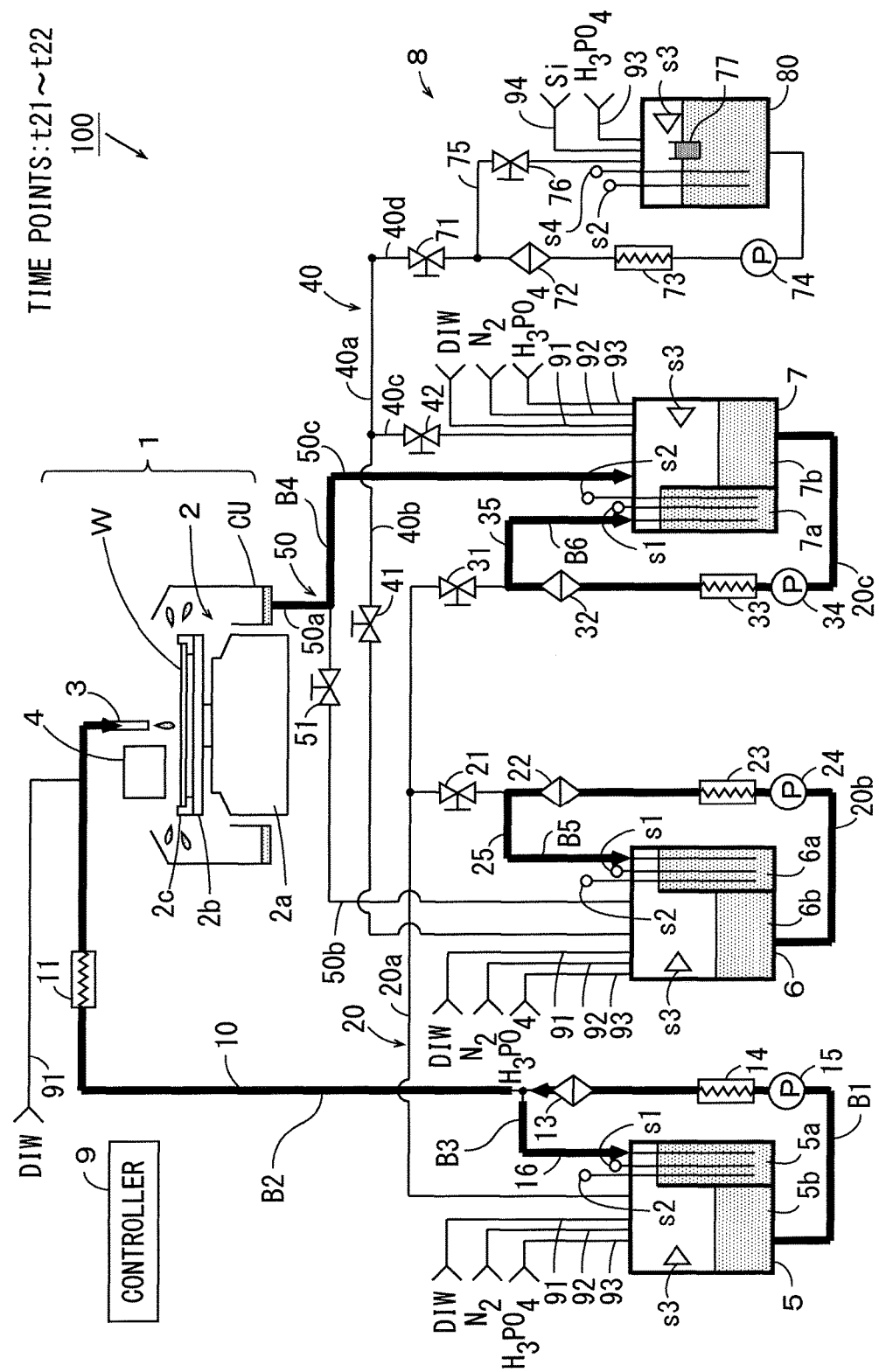
FIG. 15 is a schematic diagram showing operations of the substrate processing apparatus from a time point t21 to a time point t27 of FIG. 14.

As indicated by a thick arrow B2 in FIG. 15, part of the phosphoric acid aqueous solution that has passed through the heater 14 and the filter 13 is sent to the processing liquid nozzle 3 through another heater 11 while being heated. Thus, the phosphoric acid aqueous solution having the reference phosphoric acid concentration and the reference silicon concentration is supplied to the substrate W together with DIW from the processing liquid nozzle 3. The DIW is suitably supplied from the DIW supply system 91 to a portion between the heater 11 and the processing liquid nozzle 3. The supply of the phosphoric acid aqueous solution from the first tank 5 to the processing liquid nozzle 3 is continued until the process for the substrate W is finished as shown in FIG. 14.

On the one hand, as indicated by a thick arrow B3 in FIG. 15, the rest of the phosphoric acid aqueous solution that has passed through the heater 14 and the filter 13 is returned to a circulation tank 5a of the first tank 5 through a circulation pipe 16. In the first tank 5, the phosphoric acid aqueous solution flowing out from the circulation tank 5a flows into the storage tank 5b. In this manner, the phosphoric acid aqueous solution in the storage tank 5b is returned to the storage tank 5b through the first supply pipe 10, the circulation pipe 16 and the circulation tank 5a while being heated and filtered. Thus, the temperature and cleanliness of the phosphoric acid aqueous solution in the storage tank 5b are kept substantially constant (circulation temperature control).

At the time point t21, the controller 9 further opens the valve 52 of FIG. 11. Thus, as indicated by a thick arrow B4 in FIG. 15, the used phosphoric acid aqueous solution collected by the cup CU of the processor 1 is sent to the storage tank 7b of the third tank 7 through the main pipe 50a and the branch pipe 50c (liquid collection).

At the time point t21, the controller 9 further opens the valves 26, 36 of FIG. 11. Thus, as indicated by thick arrows B5, B6 in FIG. 15, the circulation temperature control similar to the first tank 5 is also performed in the second tank 6 and the third tank 7. The circulation temperature control in the first tank 5, the second tank 6 and the third tank 7 is continued until the process for the substrate W is finished.

When the liquid collection and the circulation temperature control are performed in the third tank 7, the phosphoric acid concentration of the phosphoric acid aqueous solution stored in the storage tank 7b is different from the reference phosphoric acid concentration. The controller 9 controls the DIW supply system 91, the nitrogen gas supply system 92 and the phosphoric acid aqueous solution supply system 93 based on the measurement value of the phosphoric acid concentration meter s1 of the third tank 7 such that the phosphoric acid concentration in the storage tank 7b becomes close to the reference phosphoric acid concentration (phosphoric acid concentration adjustment).

For example, when the phosphoric acid concentration measured by the phosphoric acid concentration meter s1 is higher than the reference phosphoric acid concentration, the controller 9 controls the DIW supply system 91 such that the DIW is supplied to the storage tank 7b. Thus, the phosphoric acid concentration in the storage tank 7b is reduced to be adjusted to the reference phosphoric acid concentration.

Further, when the phosphoric acid concentration measured by the phosphoric acid concentration meter s1 is lower than the reference phosphoric acid concentration, the controller 9 controls the phosphoric acid aqueous solution supply system 93 such that the phosphoric acid aqueous solution having the phosphoric acid concentration higher than the reference phosphoric acid concentration is supplied to the storage tank 7b. Thus, the phosphoric acid concentration in the storage tank 7b is increased to be adjusted to the reference phosphoric acid concentration.

Further, when the phosphoric acid concentration measured by the phosphoric acid concentration meter s1 is lower than the reference phosphoric acid concentration, the controller 9 controls the nitrogen gas supply system 92 such that a nitrogen gas is supplied to the storage tank 7b. In this case, evaporation of the phosphoric acid aqueous solution in the storage tank 7b is promoted. Thus, the phosphoric acid concentration in the storage tank 7b is increased to be adjusted to the reference phosphoric acid concentration.

The controller 9 may supply one of the phosphoric acid aqueous solution having the high phosphoric acid concentration and the nitrogen gas to the storage tank 7b, or may supply both of them to the storage tank 7b, in order to increase the phosphoric acid concentration in the storage tank 7b.

At the time point t22, it is detected by the liquid surface sensor s3 that the height of the liquid surface in the storage tank 5b of the first tank 5 is lowered by a predetermined height from the second reference height L2. In this case, the controller 9 opens the valve 21 of FIG. 11.

Figure 16:
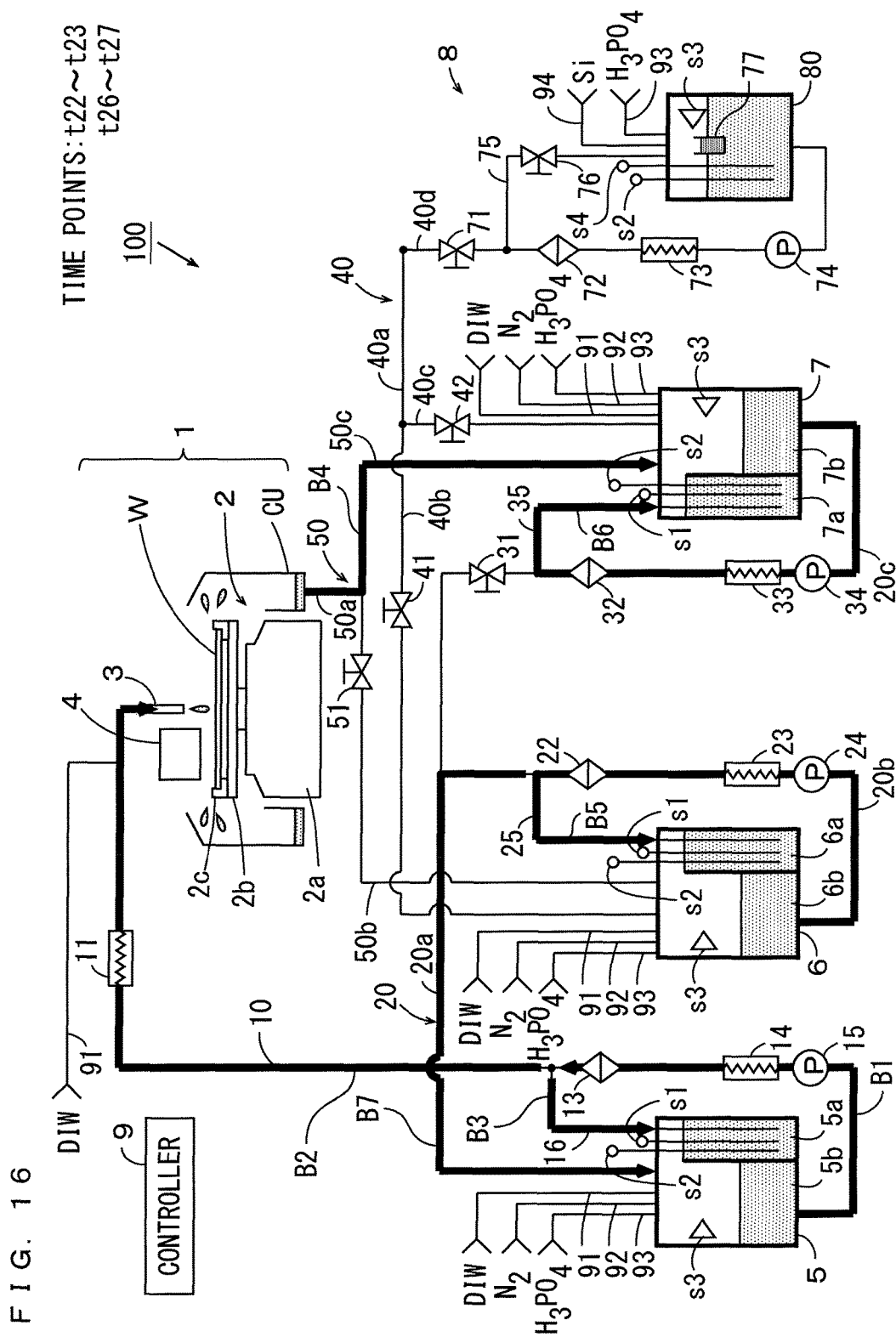
FIG. 16 is a schematic diagram showing the operations of the substrate processing apparatus from the time point t21 to the time point t27 of FIG. 14.
Figure 17:
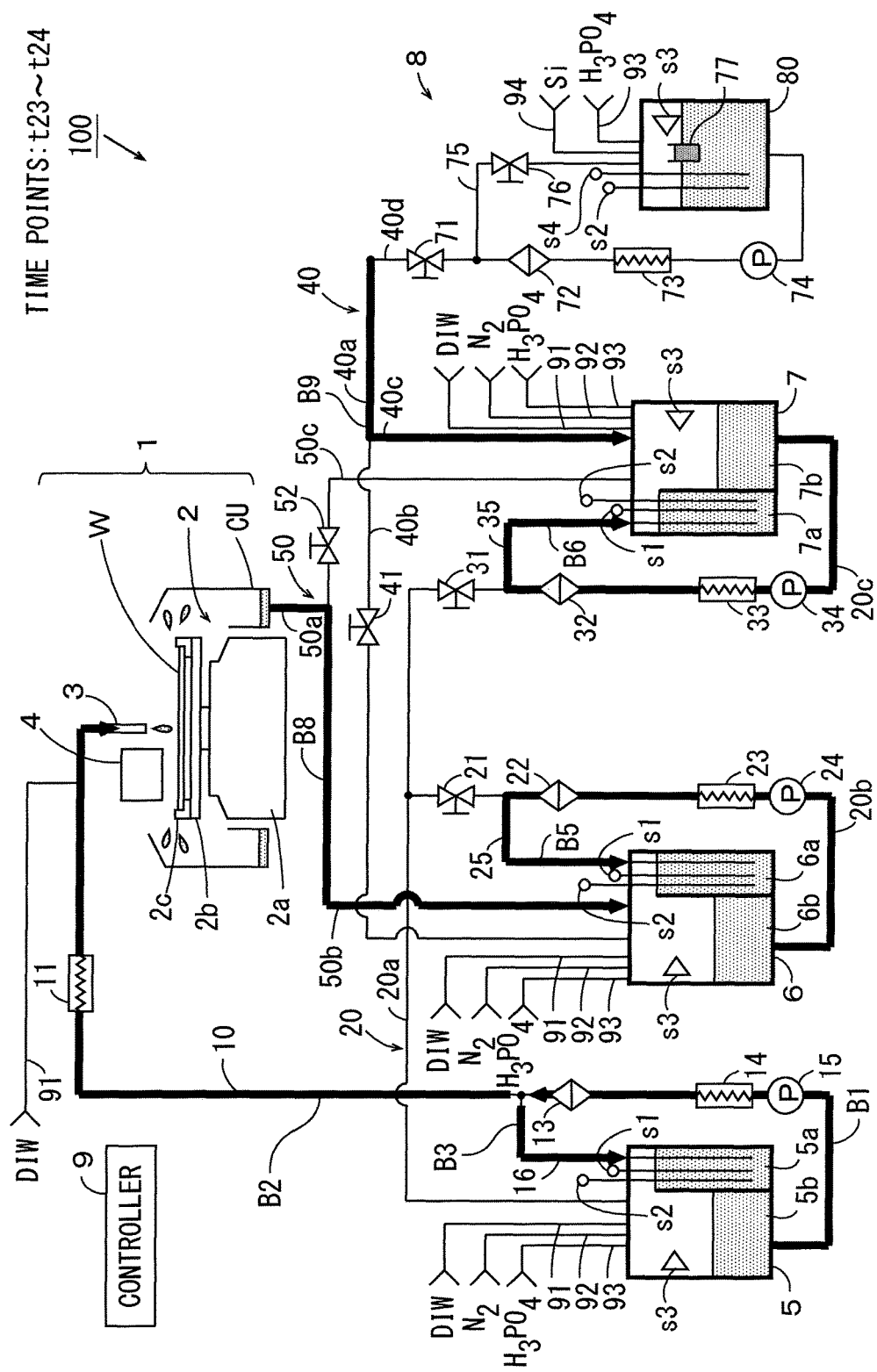
FIG. 17 is a schematic diagram showing the operations of the substrate processing apparatus from the time point t21 to the time point t27 of FIG. 14.
Figure 18:
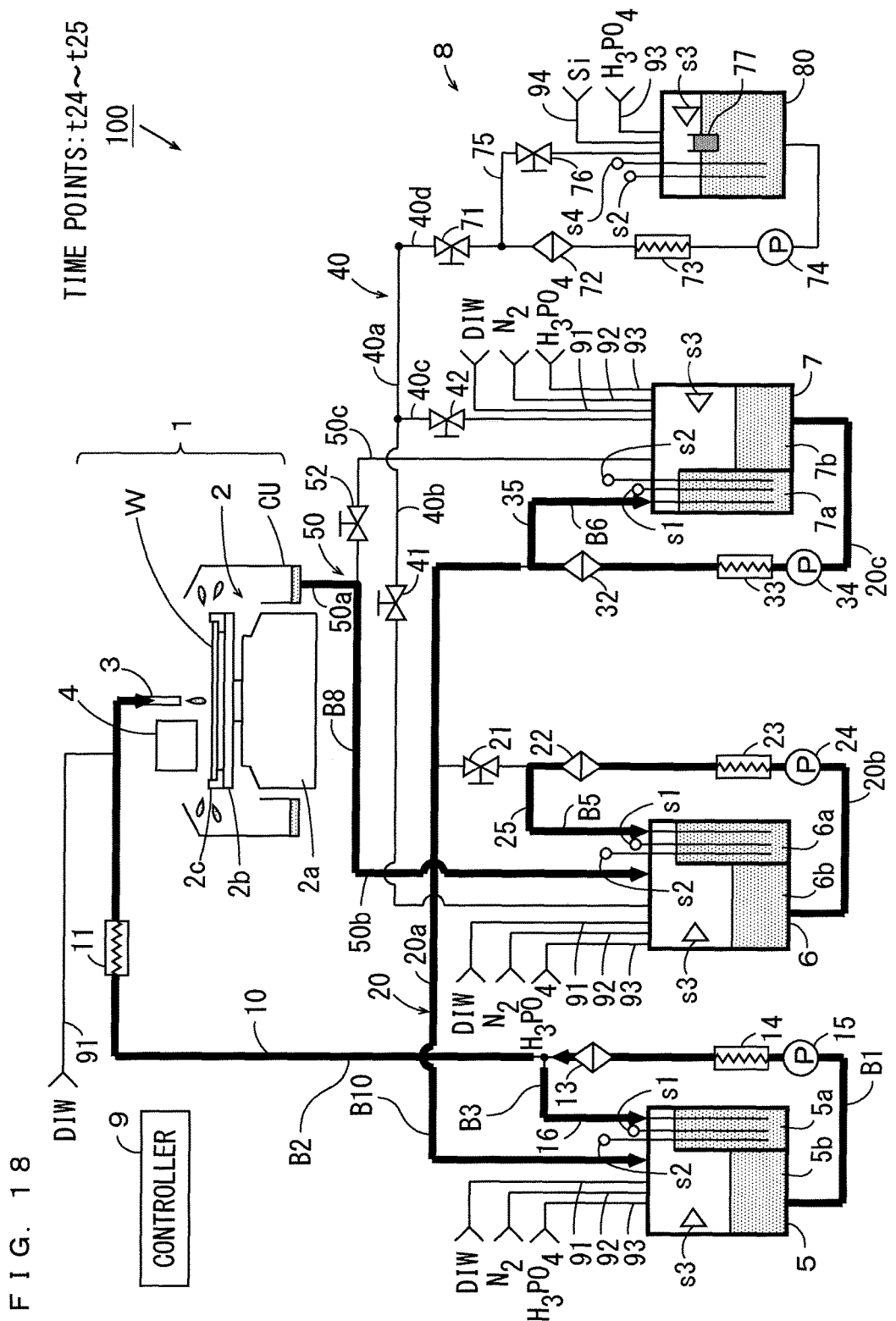
FIG. 18 is a schematic diagram showing the operations of the substrate processing apparatus from the time point t21 to the time point t27 of FIG. 14.
Figure 19:
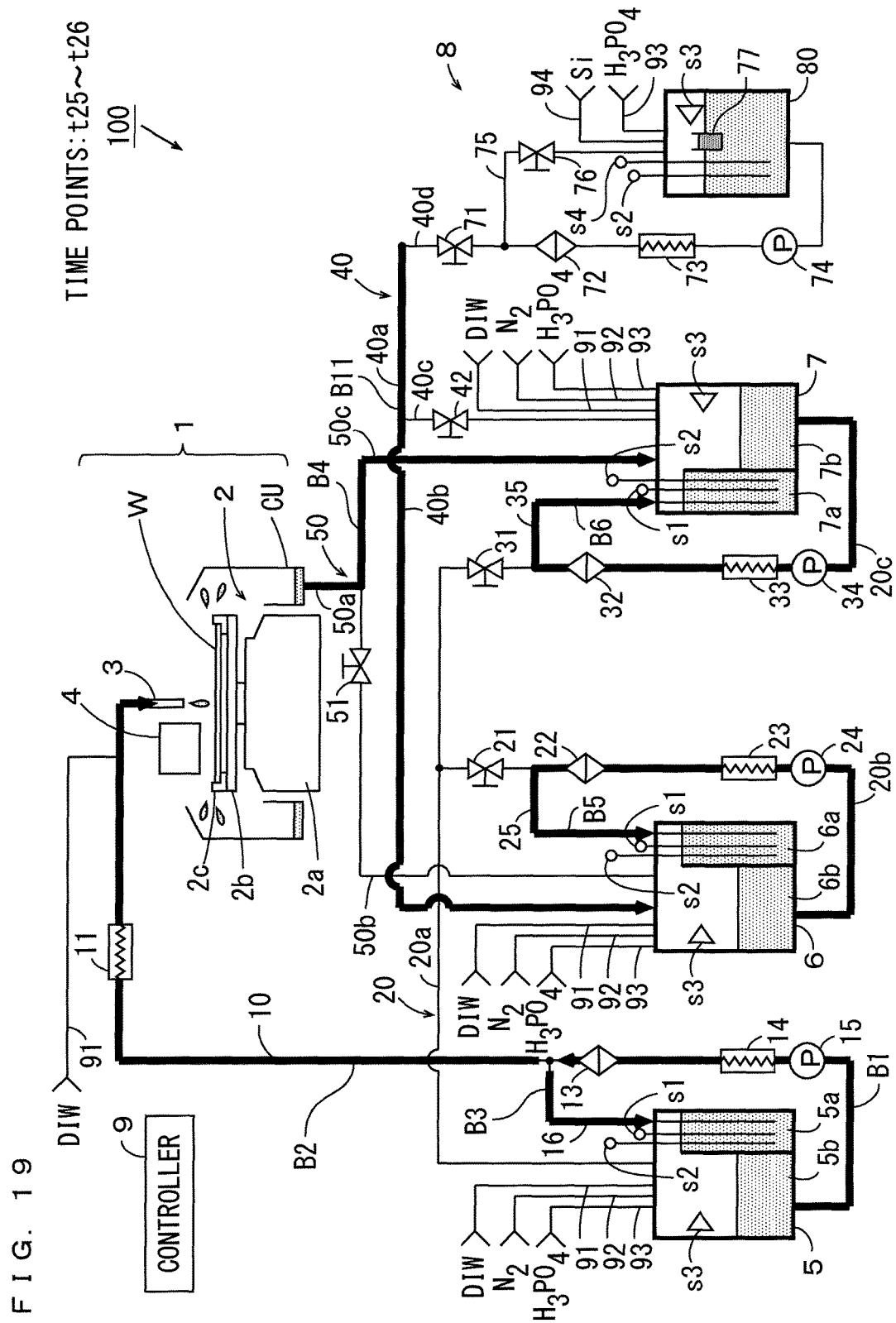
FIG. 19 is a schematic diagram showing the operations of the substrate processing apparatus from the time point t21 to the time point t27 of FIG. 14.

Thus, as indicated by a thick arrow B7 in FIG. 16, part of the phosphoric acid aqueous solution that has passed through the filter 22 through the branch pipe 20b from the storage tank 6b of the second tank 6 is sent to the storage tank 5b of the first tank 5 through the main pipe 20a. In this manner, the phosphoric acid aqueous solution having the reference phosphoric acid concentration and the reference silicon concentration is supplied from the second tank 6 to the first tank 5. Thus, the height of the liquid surface in the storage tank 5b is lifted towards the second reference height L2, and the height of the liquid surface in the storage tank 6b is lowered from the second reference height L2.

At the time point t23, it is detected by the liquid surface sensor s3 that the height of the liquid surface in the storage tank 5b of the first tank 5 is equal to the second reference height L2. In this case, the controller 9 stops the supply of the phosphoric acid aqueous solution from the second tank 6 to the first tank 5 by closing the valve 21 of FIG. 11.

At the time point t23, the controller 9 further closes the valve 52 of FIG. 11 and opens the valve 51. Thus, as indicated by a thick arrow B8 in FIG. 17, the used phosphoric acid aqueous solution collected by the cup CU of the processor 1 is sent to the storage tank 6b of the second tank 6. The phosphoric acid concentration adjustment is performed concurrently with the liquid collection in the second tank 6. On the one hand, as shown in FIG. 14, the liquid collection is stopped, and the phosphoric acid concentration adjustment is continued in the third tank 7.

In the single-substrate processing apparatus, part of the processing liquid is discarded by the rinse process and the like. Therefore; all of the processing liquid used for the process for the substrate W cannot be collected. Therefore, even when the height of the liquid surface in the storage tank 6b is lowered from the second reference height L2 to the first reference height L1 with the height of the liquid surface in the storage tank 5b being kept at the second reference height L2, the height of the liquid surface in the storage tank 7b is not lifted from the first reference height L1 to the second reference height L2.

The controller 9 controls the valve 42 and the new liquid supply device 8 of FIG. 11 based on the detection value of the liquid surface sensor s3 of the third tank 7 (FIG. 11) and the measurement value of the silicon concentration meter s2 such that the height of the liquid surface in the storage tank 7b is lifted to the second reference height L2. The controller 9 controls the valve 42 and the new liquid supply device 8 of FIG. 11 based on the detection value of the liquid surface sensor s3 of the third tank 7 (FIG. 11) and the measurement value of the silicon concentration meter s2 such that the silicon concentration of the phosphoric acid aqueous solution in the storage tank 7b becomes close to the reference silicon concentration (silicon concentration adjustment).

For example, when the silicon concentration measured by the silicon concentration meter s2 of the third tank 7 is equal to the reference silicon concentration, the controller 9 sets the reference silicon concentration to the target silicon concentration. Further, the controller 9 controls the new liquid supply device 8 such that the phosphoric acid aqueous solution having the target silicon concentration is produced, and opens the valve 42 of FIG. 11. Thus, as indicated by a thick arrow B9 in FIG. 17, the phosphoric acid aqueous solution having the target silicon concentration is supplied from the new liquid supply device 8 to the third tank 7. As a result, the height of the liquid surface in the storage tank 7b is lifted to the second reference height L2, and the silicon concentration in the storage tank 7b is kept at the reference silicon concentration.

On the one hand, when the silicon concentration measured by the silicon concentration meter s2 of the third tank 7 is lower than the reference silicon concentration, the controller 9 sets the target silicon concentration higher than the reference silicon concentration. Further, the controller 9 controls the new liquid supply device 8 such that the phosphoric acid aqueous solution having the target silicon concentration is produced, and opens the valve 42 of FIG. 11. Thus, the phosphoric acid aqueous solution having the silicon concentration higher than the reference silicon concentration is supplied from the new liquid supply device 8 to the third tank 7. As a result, the height of the liquid surface in the storage tank 7b is lifted to the second reference height L2, and the silicon concentration in the storage tank 7b is increased to be adjusted to the reference silicon concentration.

On the other hand, when the silicon concentration measured by the silicon concentration meter s2 of the third tank 7 is higher than the reference silicon concentration, the controller 9 sets the target silicon concentration lower than the reference silicon concentration. Further, the controller 9 controls the new liquid supply device 8 such that the phosphoric acid aqueous solution having the target silicon concentration is produced, and opens the valve 42 of FIG. 11. Thus, the phosphoric acid aqueous solution having the silicon concentration lower than the reference silicon concentration is supplied from the new liquid supply device 8 to the third tank 7. As a result, the height of the liquid surface in the storage tank 7b is lifted to the second reference height L2, and the silicon concentration in the storage tank 7b is lowered to be adjusted to the reference silicon concentration.

In the present embodiment, when the silicon concentration adjustment is performed, the phosphoric acid concentration adjustment is performed concurrently with the silicon concentration adjustment. Thus, even when the phosphoric acid aqueous solution supplied from the new liquid supply device 8 to the third tank 7 does not have the reference phosphoric acid aqueous solution, the phosphoric acid concentration in the storage tank 7b is adjusted to the reference phosphoric acid concentration.

At the time point t24, it is detected by the phosphoric acid concentration meter s1 and the silicon concentration meter s2 that the phosphoric acid aqueous solution having the reference phosphoric acid concentration and the reference silicon concentration is stored in the storage tank 7b of the third tank 7. In this case, the controller 9 stops the supply of the phosphoric acid aqueous solution from the new liquid supply device 8 to the third tank 7 by closing the valve 42 of FIG. 11 and finishes the silicon concentration adjustment in the third tank 7. Simultaneously, the controller 9 also finishes the phosphoric acid aqueous concentration adjustment in the third tank 7.

In the present embodiment, a necessary time period from the time when the silicon concentration adjustment is started in the second tank 6 and the third tank 7 until the silicon concentration adjustment is completed in the second tank 6 and the third tank 7 is sufficiently shorter than a necessary time period for the height of the liquid surface in the storage tank 5b to be lowered from the second reference height L2 to the first reference height L1 by the process for the substrate W.

At the time point t24, the controller 9 further opens the valve 31 of FIG. 11. Thus, as indicated by a thick arrow B10 in FIG. 18, part of the phosphoric acid aqueous solution that has passed through the branch pipe 20c and the filter 32 from the storage tank 7b of the third tank 7 is sent to the storage tank 5b of the first tank 5 through the main pipe 20a. In this manner, the phosphoric acid aqueous solution having the reference phosphoric acid concentration and the reference silicon concentration is supplied from the third tank 7 to the first tank 5. Thus, the height of the liquid surface in the storage tank 5b is lifted towards the second reference height L2, and the height of the liquid surface in the storage tank 7b is lowered from the second reference height L2.

At the time point t25, it is detected by the liquid surface sensor s3 that the height of the liquid surface of the first tank 5 is equal to the second reference height L2. In this case, the controller 9 stops the supply of the phosphoric acid aqueous solution from the third tank 7 to the first tank 5 by closing the valve 31 of FIG. 11.

At the time point t25, the controller 9 opens the valve 41 of FIG. 11 after producing the phosphoric acid aqueous solution having the target silicon concentration by controlling the new liquid supply device 8. Thus, as indicated by a thick arrow B11 in FIG. 19, the phosphoric acid aqueous solution having the target silicon concentration is supplied from the new liquid supply device 8 to the second tank 6. In this manner, the silicon concentration of the phosphoric acid aqueous solution in the storage tank 6b is adjusted to the reference silicon concentration. Further, the phosphoric acid concentration adjustment is performed concurrently with this silicon concentration adjustment.

At the time point t25, the controller 9 further closes the valve 51 of FIG. 11, and opens the valve 52 of FIG. 11. Thus, as indicated by a thick arrow B4 in FIG. 19, the used phosphoric acid aqueous solution collected by the cup CU of the processor 1 is sent to the storage tank 7b of the third tank 7 through the main pipe 50a and the branch pipe 50c. Simultaneously, the controller 9 starts the phosphoric acid concentration adjustment in the third tank 7.

At the time point t26, it is detected by the phosphoric acid concentration meter s1 and the silicon concentration meter s2 that the phosphoric acid aqueous solution having the reference phosphoric acid concentration and the reference silicon concentration is stored in the storage tank 6b of the second tank 6. In this case, the controller 9 stops the supply of the phosphoric acid aqueous solution from the new liquid supply device 8 to the second tank 6 by closing the valve 41 of FIG. 11, and finishes the silicon concentration adjustment in the second tank 6. Simultaneously, the controller 9 also finishes the phosphoric acid concentration adjustment in the second tank 7.

At the time point t26, the controller 9 further opens the valve 21 of FIG. 11. In this case, the phosphoric acid aqueous solution having the reference phosphoric acid concentration and the reference silicon concentration is supplied from the second tank 6 to the first tank 5. Thus, the height of the liquid surface in the storage tank 5b is lifted towards the second reference height L2, and the height of the liquid surface in the storage tank 6b is lowered from the second reference height L2.

At the time point t27, it is detected by the liquid surface sensor s3 that the height of the liquid surface in the storage tank 5b of the first tank 5 is equal to the second reference height L2. In this case, the controller 9 stops the supply of the phosphoric acid aqueous solution from the second tank 6 to the first tank 5 by closing the valve 21 of FIG. 11.

After the time point t27, the operations from the time point t23 to the time point t25 and the operations from the time point t25 to the time point t27 are repeated until the process for the substrate W is stopped. Thus, in the first tank 5, the phosphoric acid aqueous solution having the reference phosphoric acid concentration and the reference silicon concentration is held at all times.

(4) Modified Examples

Figure 20:
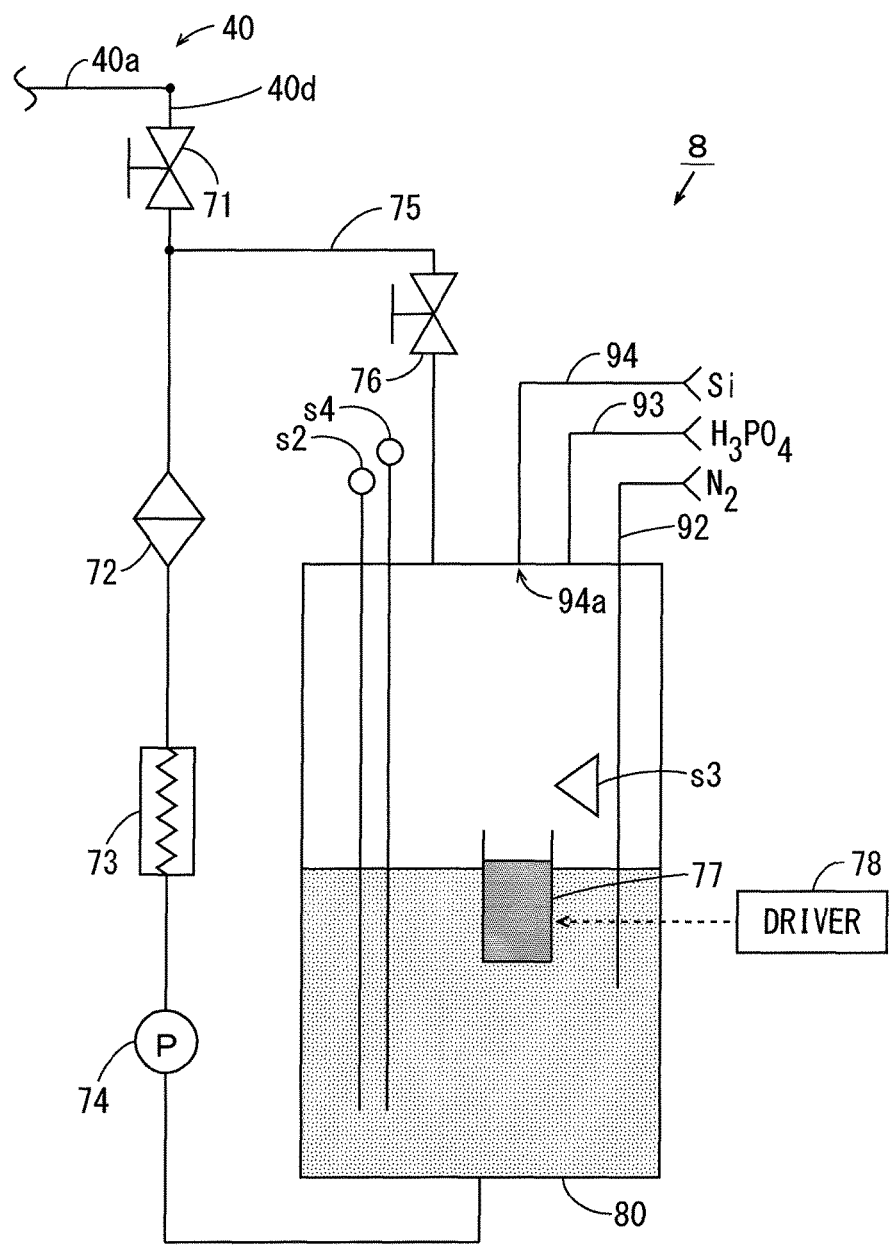
FIG. 20 is a schematic diagram showing a configuration of a new liquid supply device according to a first modified example in the third embodiment.

FIG. 20 is a schematic diagram showing a configuration of a new liquid supply device according to a first modified example in the third embodiment. The new liquid supply device 8 of FIG. 20 has the configuration similar to the new liquid supply device 8 of FIG. 12 except for the following points.

As shown in FIG. 20, the nitrogen gas supply system 92 is connected to the production tank 80 of the new liquid supply device 8 according to the first modified example. A nitrogen gas is supplied to the processing liquid in the production tank 80 from the nitrogen gas supply system 92. Thus, the processing liquid in the production tank 80 is stirred.

Figure 21:
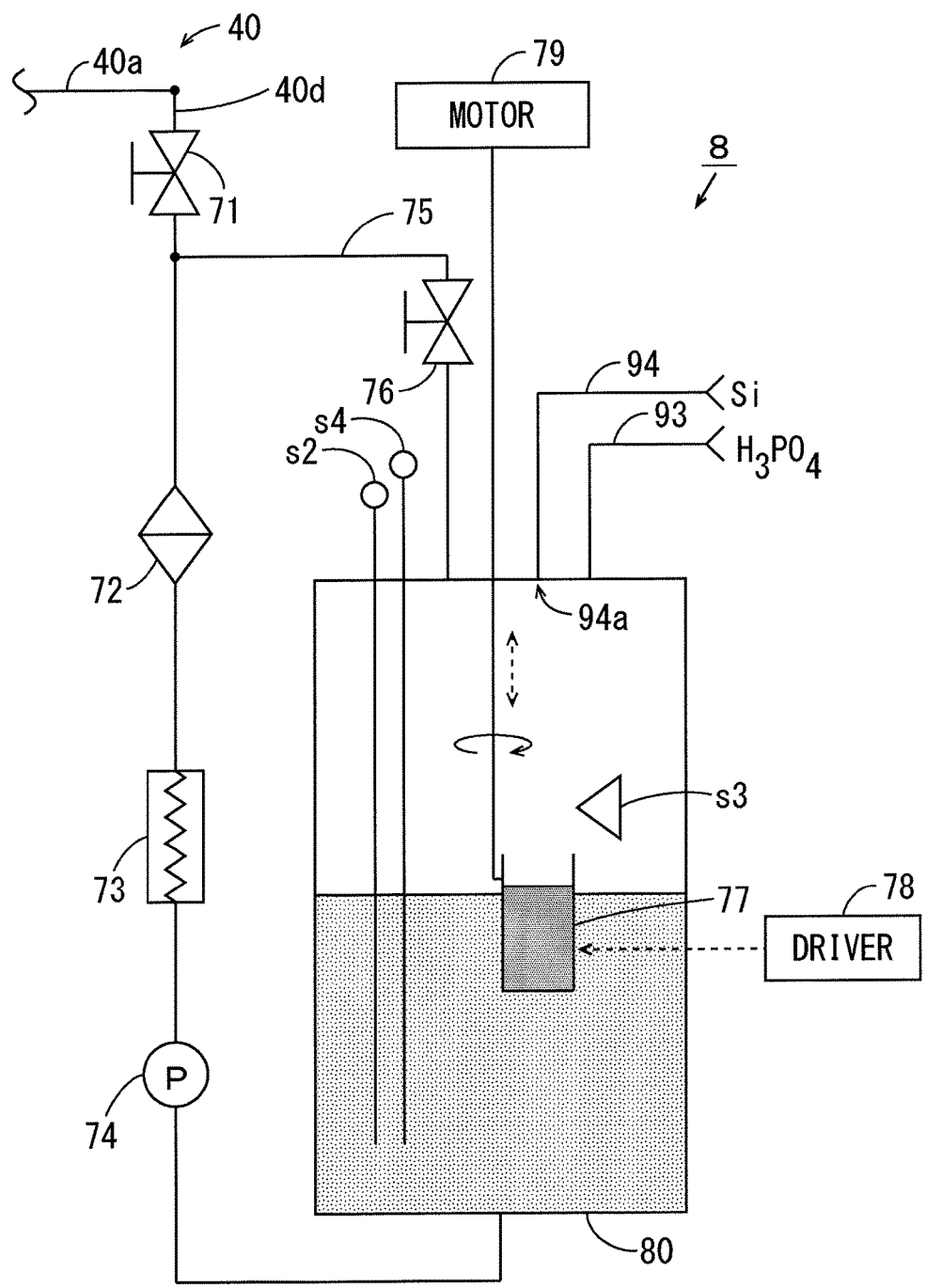
FIG. 21 is a schematic diagram showing a configuration of a new liquid supply device according to a second modified example in the third embodiment.

FIG. 21 is a schematic diagram showing a configuration of a new liquid supply device according to a second modified example in the third embodiment. The new liquid supply device 8 of FIG. 21 has the configuration similar to the new liquid supply device 8 of FIG. 12 except for the following points.

As shown in FIG. 21, the production tank 80 of the new liquid supply device 8 according to the second modified example further includes a motor 79 connected to the filtration member 77. The motor 79 rotates the filtration member 77 with the filtration member 77 being located at the dipping position. Alternatively, the motor 79 subtly swings the filtration member 77 in a horizontal direction while subtly vibrating the filtration member 77 in the vertical direction with the filtration member 77 being located at the dipping position. Thus, the processing liquid in the production tank 80 is stirred.

In the new liquid supply device 8 according to the first and second modified examples, the silicon containing liquid filtered by the filtration member 77 is efficiently mixed with the phosphoric acid aqueous solution. Thus, the production of the processing liquid can be promoted. The motor 79 of FIG. 21 may be provided in the new liquid supply device 8 of FIG. 20. In this case, the production of the processing liquid can be more sufficiently promoted.

(5) Effects of Third Embodiment

In the present embodiment, the phosphoric acid aqueous solution is stored in the production tank 80. The silicon containing liquid including the silicon particles is stored in the filtration member 77 formed of the porous material having the bore diameter not more than the bore diameter of the filter 72. At least part of the filtration member 77 is dipped in the phosphoric acid aqueous solution stored in the production tank 80. In this case, the silicon containing liquid is permeated through the filtration member 77 and mixed with the phosphoric acid aqueous solution, so that the processing liquid including the silicon and the phosphoric acid is produced. Impurities in the produced processing liquid are removed by the filter 72. The processing liquid from which impurities are removed by the filter 72 is supplied to the substrate W by the processor 1 in order to selectively remove the silicon nitride of the silicon oxide and the silicon nitride on the substrate W.

This configuration causes the only silicon particles that can be dissolved in the phosphoric acid aqueous solution to be mixed with the phosphoric acid aqueous solution and the other silicon particles to remain in the filtration member 77. In this case, an occurrence of aggregates of silicon due to aggregation of the excessive amount of the silicon particles in the production tank 80 is prevented. Thus, an occurrence of clogging of the filter 72 is prevented. Further, the processing liquid having the uniform silicon concentration can be stably produced in a short period of time. As a result, the process of selectively etching the silicon nitride film of the silicon oxide film and the silicon nitride film on the substrate W can be accurately performed.

[4] Other Embodiments (1) In the first embodiment, the silicon containing liquid supply system 94 of FIG. 2 includes the constant delivery pump that discharges a constant amount (5 cc, for example) of the silicon containing liquid to the circulation pipe 87a. The silicon containing liquid supply system 94 is not limited to the above-mentioned example. The silicon containing liquid supply system 94 may include a pump that can successively discharge the silicon containing liquid at a constant or any flow rate (6 to 25 cc/min, for example) instead of the constant delivery pump.

(2) In the first embodiment, the silicon containing liquid supply system 94 of FIG. 2 discharges the silicon containing liquid to the circulation pipe 87a. The silicon containing liquid supply system 94 may discharge the silicon containing liquid into the production tank 80 of FIG. 2 instead of the circulation pipe 87a.

(3) In the first embodiment, the dispersion state determinator 89 of FIG. 2 is constituted by the silicon concentration meter 89a and the determinator 89b. The configuration of the dispersion state determinator 89 is not limited to the above-mentioned example. The following configuration can be used as the dispersion state determinator 89, for example.

For example, a time period from the time when a predetermined amount of the silicon containing liquid is supplied to a predetermined amount of the phosphoric acid aqueous solution to the time when the supplied silicon particles are uniformly dispersed in the phosphoric acid aqueous solution is acquired by an experiment. Thereafter, the result of the experiment is stored in the memory of the determinator 89b as a table. In this case, the determinator 89b may determine whether the silicon particles are uniformly dispersed in the phosphoric acid aqueous solution based on the table stored in the memory and a time period measured by a timing function. Further, in this case, the controller 9 of FIG. 1 may perform the same determination process as the determinator 89b.

Further, a dispersion state detection device that detects a dispersion state of the silicon particles in the phosphoric acid aqueous solution using a laser or ultrasonic may be used instead of the silicon concentration meter 89a of FIG. 2. In this case, when the dispersion state of the silicon particles is kept in a constant range for a constant time period, the determinator 89b may determine that the supplied silicon particles are uniformly dispersed in the phosphoric acid aqueous solution.

(4) In the first embodiment, the production tank 80 has the cylindrical sidewall. The production tank 80 is not limited to the above-mentioned example, and may have an elliptically cylindrical sidewall or a prismatic sidewall.

(5) In the processor 1 of the substrate processing apparatus 100 according to the first embodiment, the first, second and third tanks 5, 6, 7 are used as the tank for storing the phosphoric acid aqueous solution. The invention is not limited to this. A larger number of tanks may be provided in the substrate processing apparatus 100.

(6) In the processor 1 of the substrate processing apparatus 100 according to the first embodiment, the processing liquid nozzle 3 that supplies the phosphoric acid aqueous solution to the substrate W is provided. Additionally, in the processor 1, a rinse liquid nozzle that supplies a rinse liquid to the substrate W may be provided, or another processing liquid nozzle that supplies another chemical liquid other than the phosphoric acid aqueous solution to the substrate W may be provided. Thus, the contents of processes for the substrate W in the processor 1 vary.

The rinse liquid includes pure water, carbonated water, ozonated water, magnetic water, regenerated water (hydrogen water) or ionized water or an organic solvent such as IPA (isopropyl alcohol) or the like.

(7) In the first embodiment, in the silicon concentration adjustment, the silicon concentration of the phosphoric acid aqueous solution stored in the second tank 6 or the third tank 7 is adjusted to the reference silicon concentration. The invention is not limited to this. In the silicon concentration adjustment, the silicon concentration of the phosphoric acid aqueous solution may be adjusted in a predetermined range including the reference silicon concentration. In this case, it is possible to shorten the necessary time period for the silicon concentration adjustment by increasing the range to be adjusted as necessary.

(8) While the substrate processing apparatus 100 is a single-substrate processing apparatus in the first to third embodiments, the invention is not limited to this. The substrate processing apparatus 100 may be a batch-type substrate processing apparatus.

(9) While the circulation pipe 75 is provided in the new liquid supply device 8 in the third embodiment, the invention is not limited to this. The circulation pipe 75 does not have to be provided in the new liquid supply device 8.

(10) While the filtration member 77 is formed of the filtration film made of PTFE in the third embodiment, the invention is not limited to this. The filtration member 77 may be formed of a porous polyimide resin or a porous epoxy resin, for example.

(11) While part of the filtration member 77 is dipped in the liquid in the production tank 80 in the third embodiment, the invention is not limited to this. After the silicon containing liquid is stored in the filtration member 77, when an upper portion of the filtration member 77 is closed, all of the filtration member 77 may be dipped in the liquid in the production tank 80.

(12) While the preparation position is provided in the production tank 80 in the third embodiment, the invention is not limited to this. The preparation position does not have to be provided in the production tank 80. In this case, the filtration member 77 is arranged at the dipping position, and the process of step S5 of FIG. 13 is performed after the process of step S4. The process of step S6 is omitted.

[5] Correspondences between Constituent Elements in Claims and Parts in Preferred Embodiments In the following paragraphs, non-limiting examples of correspondences between various elements recited in the claims below and those described above with respect to various preferred embodiments of the present invention are explained.

(1) In the first and second embodiments, the substrate processing apparatus 100 of FIGS. 1 and 10 is an example of a substrate processing apparatus. In the substrate processing apparatus 100 of FIG. 1, the new liquid supply device 8, the controller 9 and the dispersion state determinator 89 are examples of a processing liquid producer, the filter 82 is an example of a filter, the processor 1 is an example of a processing unit, the phosphoric acid aqueous solution is an example of a first solution and the production tank 80 is an example of a production tank.

Further, the silicon containing liquid is an example of a second solution, the silicon containing liquid supply system 94 is an example of a solution supply system, the bypass pipe 86a is an example of a bypass path, the coupling pipe 40x, the bypass pipe 86a and the circulation pipe 87a are examples of a circulation system, the dispersion state determinator 89 is an example of a dispersion state determinator, and the controller 9 and the valves 83, 86b are examples of a switcher.

Further, the heater 84 is an example of a heater, the temperature sensor s4 is an example of a temperature measurer, the time period from the time point t1 to the time point t2 of FIG. 3 is an example of a constant time period until the second solution is supplied to the production tank.

Further, the organic solvent included in the silicon containing liquid is an example of an aggregation inhibitor, the silicon concentration meter 89a is an example of a silicon concentration meter, the time period TI is an example of a reference time period, the allowable range RA is an example of a reference range, the determinator 89b is an example of a determinator, the spin chuck 2 is an example of a holder, and the processing liquid nozzle 3 is an example of a processing liquid nozzle.

In the substrate processing apparatus 100 of FIG. 10, the second tank 6, the third tank 7, the controller 9, the bypass pipes 186a, 286a, the circulation pipes 25, 35, the upstream branch pipe portions b1, c1, the dispersion state determinator 89, and the valves 183, 186b, 283, 286b are examples of a processing liquid producer, and the filters 22, 32 are examples of a filter.

Further, the second tank 6 and the third tank 7 are examples of a production tank, the bypass pipes 186a, 286a are examples of a bypass path, the upstream branch pipe portion b1, the bypass pipe 186a and the circulation pipe 25 are examples of a circulation system, the upstream branch pipe portion c1, the bypass pipe 286a and the circulation pipe 35 are examples of a circulation system, the valves 183, 186b and the controller 9 are examples of a switcher, and the valves 283, 286b and the controller 9 are examples of a switcher.

(2) In the third embodiment, the new liquid supply device 8 is an example of a processing liquid producer, the filter 72 is an example of a filter, the processor 1 is an example of a processing unit, and the production tank 80 is an example of a production tank. The filtration member 77 is an example of a filtration member, the substrate processing apparatus 100 is an example of a substrate processing apparatus, the circulation pipe 75 is an example of a circulation system, the heater 73 is an example of a heater, and the temperature sensor s4 is an example of a temperature measurer. The controller 9 is an example of a controller, the driver 78 is an example of a driver, the nitrogen gas supply system 92 or the motor 89 is an example of a stirring mechanism.

(3) As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for processes for substrates.

We claim:

1. A substrate processing method including the steps of:
supplying a first processing liquid including silicon and phosphoric acid from a first tank to a substrate on which a silicon oxide and a silicon nitride are formed;
collecting the first processing liquid supplied to the substrate as a collection liquid to a second tank;
producing a second processing liquid including silicon and phosphoric acid using a production tank that is provided separately from the first tank and the second tank;
supplying the second processing liquid from the production tank to a supply pipe that connects the production tank and the second tank and into which a filter is inserted, to remove impurities in the second processing liquid by the filter;
supplying the second processing liquid from which the impurities are removed by the filter from the supply pipe to the second tank and mixing the second processing liquid with the collection liquid to produce the first processing liquid; and
supplying the first processing liquid from the second tank to the first tank,
the second processing liquid being produced by mixing a first solution including phosphoric acid with a second solution including silicon particles,
wherein the step of producing the second processing liquid includes the steps of:
storing the first solution supplying the second solution to the production tank after storing the first solution in the production tank,
switching between a first state in which a liquid in the production tank is sent from the production tank and passes through a first circulation path and a second state in which the liquid in the production tank is sent from the production tank and passes through a second circulation path, and determining whether the silicon particles are dispersed in the first solution to a predetermined degree while supplying the first and second solutions from the production tank to the first circulation path in the first state, the first circulation path being a path that extends from the production tank and returns to the production tank through a bypass pipe bypassing the filter, the second circulation path being a path that extends from the production tank and returns to the production tank through the filter, and the step of switching between the first state and the second state includes the steps of:

switching the second state to the first state after the supply of the second solution to the production tank, and switching the first state to the second state when it is determined that the silicon particles are dispersed to the predetermined degree in the step of determining.

2. The substrate processing method according to claim 1, wherein the step of producing the second processing liquid further includes the steps of:

(a) heating the first solution stored in the production tank after storing the first solution in the production tank and before supplying the second solution to the production tank, (b) measuring a temperature of the first solution after the step (a), (c) switching the first state to the second state when the temperature of the first solution measured in the step (b) has reached a predetermined threshold temperature, to heat the filter by the first solution, before the supply of the second solution to the production tank, and (d) switching the second state to the first state at a time point at which a predetermined time period has elapsed since a time point at which the first state is switched to the second state in the step (c), wherein the step of supplying the second solution to the production tank is executed after the step (d).

3. The substrate processing method according to claim 1, wherein the step of determining includes the steps of:

(e) sequentially sampling part of the first and second solutions in the production tank and sequentially measuring silicon concentrations of the sampled first and second solutions, and (f) determining that the silicon particles are dispersed to the predetermined degree in the first and second solutions when the silicon concentrations measured by the step (e) in a predetermined reference range for a predetermined time period.

4. The substrate processing method according to claim 1, wherein the step of supplying the first processing liquid from the first tank to the substrate includes the steps of:

holding the substrate in a horizontal attitude by a holder, rotating the substrate held by the holder about a vertical axis, and supplying the first processing liquid to the rotated substrate using a nozzle.

5. The substrate processing method according to claim 1, wherein the step of determining includes the steps of:

(e) storing in advance information relating to a time period from a time when the second solution is supplied to the production tank to a time when the silicon particles included in the supplied second solution are dispersed to the predetermined degree in the first solution, (f) measuring an elapsed time from the time at which the second solution is supplied to the production tank, and (g) determining whether the silicon particles included in the second solution are uniformly dispersed in the first solution based on the elapsed time measured by the step (f) and based on the time period until the time when the silicon particles are uniformly dispersed in the first solution, stored by the step (e).

6. The substrate processing method according to claim 1, wherein the step of determining includes the steps of:

(e) sequentially detecting a dispersion state of the silicon particles in the liquid in the production tank using a laser or an ultrasonic, and (f) determining that the silicon particles are dispersed to the predetermined degree in the first and second solutions when the dispersion state detected by the step (e) has been in a predetermined range for a predetermined time period.

7. A substrate processing method including the steps of:

supplying a first processing liquid including silicon and phosphoric acid from a first tank to a substrate on which a silicon oxide and a silicon nitride are formed;

producing a second processing liquid including silicon and phosphoric acid using a production tank;

supplying the second processing liquid from the production tank to a supply pipe that connects the production tank and the first tank and into which a filter is inserted, to remove impurities in the second processing liquid by the filter; and supplying the second processing liquid from which the impurities are removed by the filter as the first processing liquid from the supply pipe to the first tank, wherein the step of producing the second processing liquid includes the steps of:

collecting the first processing liquid supplied to the substrate as a collection liquid to the production tank, supplying a first solution including phosphoric acid to the production tank, supplying a second solution including silicon particles to the production tank, switching between a first state in which a liquid in the production tank is sent from the production tank and passes through a first circulation path and a second state in which the liquid in the production tank is sent from the production tank and passes through a second circulation path, and determining whether the silicon particles in the production tank containing the first solution, the second solution, and the collection liquid are dispersed to a predetermined degree while supplying the first solution, the second solution, and the collection liquid from the production tank to the first circulation path in the first state, the first circulation path being a path that extends from the production tank and returns to the production tank through a bypass pipe bypassing the filter, the second circulation path being a path that extends from the production tank and returns to the production tank through the filter, and the step of switching includes the steps of:

switching the second state to the first state after the supply of the second solution to the production tank, and switching the first state to the second state when it is determined that the silicon particles are dispersed to the predetermined degree in the step of determining.

* * * * *